(12) United States Patent
Kuitani et al.

(10) Patent No.: US 7,474,109 B2
(45) Date of Patent: Jan. 6, 2009

(54) CONTACT TERMINAL FOR MEASUREMENT, MEASUREMENT APPARATUS, PROBE CARD SET, WAFER PROBE APPARATUS, AND TESTING APPARATUS

(75) Inventors: Tetsuya Kuitani, Tokyo (JP); Tadao Saito, Tokyo (JP); Shigeru Matsumura, Tokyo (JP); Shin Sakiyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/438,605

(22) Filed: May 22, 2006

(65) Prior Publication Data

US 2006/0279304 A1 Dec. 14, 2006

(30) Foreign Application Priority Data

May 26, 2005 (JP) ............................. 2005-154648

(51) Int. Cl.
*G01R 31/02* (2006.01)

(52) U.S. Cl. ..................................... 324/754

(58) Field of Classification Search ................. 324/754, 324/761, 158.1, 756, 537, 601; 73/1.1, 1.42; 382/151
See application file for complete search history.

(56) References Cited

U.S. PATENT DOCUMENTS

| | | | | |
|---|---|---|---|---|
| 5,355,079 A | * | 10/1994 | Evans et al. | 324/754 |
| 6,239,590 B1 | * | 5/2001 | Krivy et al. | 324/158.1 |
| 6,927,078 B2 | * | 8/2005 | Saijyo et al. | 438/10 |
| 7,285,969 B2 | * | 10/2007 | Hayden et al. | 324/754 |
| 2003/0210033 A1 | * | 11/2003 | Strid et al. | 324/158.1 |
| 2004/0041581 A1 | * | 3/2004 | Saijyo et al. | 324/765 |

* cited by examiner

*Primary Examiner*—Ha Tran T Nguyen
*Assistant Examiner*—Arleen M Vazquez
(74) *Attorney, Agent, or Firm*—Osha • Liang LLP

(57) ABSTRACT

A contact terminal for measurement is provided, for transmitting a signal between a desired probe pin among a plurality of probe pins arranged in parallel at a predetermined distance in a predetermined direction on the surface of a probe substrate and an external measurement apparatus. The contact terminal for measurement includes: a signal terminal having an width smaller than the distance between the probe pins provided on both sides of one probe pin in the arrangement direction; two ground terminals to which a ground potential is applied, which are provided on both sides of the signal terminal in the arrangement direction and which have each width larger than that of the signal terminal in the arrangement direction; and a signal line electrically connecting the signal terminal to a signal input terminal of the external measurement apparatus.

18 Claims, 12 Drawing Sheets

CONTACT TERMINAL FOR MEASUREMENT, MEASUREMENT APPARATUS, PROBE CARD SET, WAFER PROBE APPARATUS, AND TESTING APPARATUS

CROSS REFERENCE TO RELATED APPLICATION

The present application claims priority from a Japanese Patent Application(s) No. 2005-154648 filed on May 26, 2005, the contents of which are incorporated herein by reference.

BACKGROUND OF THE INVENTION

1. Field of the Invention

The present invention relates to a contact terminal for measurement, a measurement apparatus, a probe card set an wafer probe apparatus and a testing apparatus. Particularly, the present invention relates to a contact terminal for measurement for the transmission characteristic of probe pins in a semiconductor testing apparatus, a measurement apparatus for measuring the transmission characteristic of the probe pins and a probe card set including the probe pins and the contact terminal for measurement.

2. Related Art

Generally, a probe card in contact with a device under test and electrically connecting a testing apparatus body and the device under test has been used in a testing apparatus for testing the device under test such as a semiconductor circuit. The probe card includes a plurality of probe pins in contact with input/output pins of the device under test. The probe pins are designed to have a predetermined transmission characteristic, and the transmission characteristic for each of the probe pins has errors due to production tolerance.

When the transmission characteristic has any error, the device under test can not accurately tested. Therefore, the transmission characteristic for each of the probe pins has to be measured before testing the device under test to correct a signal transmitted through each of the probe pins.

Conventionally, a method has been known, for transmitting a signal from a testing apparatus to the probe pin and measuring a signal outputted from a probe pin in order to measure the transmission characteristic of the probe pin. In the method, the signal outputted from the probe pin is received through a contact terminal for measurement in contact with the probe pin to measure a signal waveform.

As such the above-described contact terminal for measurement, a contact terminal for measurement having signal pins provided at a predetermined distance and a grounding pin. The contact terminal for measurement causes the signal pins to be contact with the probe pin of which transmission characteristic should be measured and causes the grounding pin to be contact with the probe pin to which a ground potential is applied to detect the signal outputted by the probe pin.

However, the grounding pin for the conventional contact terminal for measurement has an width enough to be in contact with one probe pin, so that when the distance between the signal pin and the grounding pin, and the distance between the probe pin of which transmission characteristic should be measured and the probe pin to which the ground potential is applied are not matched, the signal waveform can not be detected. Therefore, the conventional measurement apparatus should have included a plurality of contact terminals for measurement having each different distance between the signal pins and the grounding pin.

Generally, a probe pin is a component having the life time. Initially, the probe pin has a predetermined dimensional accuracy within a manufacturing standard. For example, the relative position, height tolerance and contact resistance of the plurality of probe pins are set within a predetermined standard. However, as the result of repeated contacting operations on the surface of an wafer being the device under test several tens of thousands times to several hundreds of thousands times, elastic fatigue of the probe pin and electric abrasion and deterioration in the contacting portion are increased. Additionally, since the test is performed under a high-temperature condition, the shape distortion and deterioration are generated due to the thermal stress. Accordingly, the contact resistance of the probe pin is deteriorated and the contact is failed due to the deterioration such as a physical displacement. Therefore, it is necessary to measure the position of the probe pin and the characteristic such as contact resistance.

SUMMARY OF THE INVENTION

Thus, an object of the present invention is to provide a contact terminal for measurement, a measurement apparatus, a probe card set, an wafer probe apparatus and a testing apparatus being capable of solving the problem accompanying the conventional art. This object is achieved by combining the features recited in independent claims. Then, dependent claims define further effective specific example of the present invention.

In order to solve the above-described problem, a first aspect of the present invention provides a contact terminal for measurement for transmitting signals between a desired probe pin among a plurality of probe pins arranged in parallel at a predetermined distance in a predetermined arrangement direction on the surface of a probe substrate and an external measurement apparatus. The contact terminal for measurement includes: a signal terminal having an width smaller than the distance between probe pins provided on both sides of one probe pin in the arrangement direction; two ground terminals to which a ground potential is applied, which are provided on both sides of the signal terminals in the arrangement direction and which have each width larger than that of the signal terminal; and a signal line for electrically connecting the signal terminal and a signal input terminal of the external measurement apparatus.

The width of the signal terminal may be smaller than the predetermined distance. The width for each of the ground terminals may be larger than the sum of the width of the probe pin and the predetermined distance. Each of the ground terminals in the arrangement direction may have an width enough to be contact with all of the plurality of probe pins provided on both sides of the probe pins in the arrangement direction when the signal terminal is in contact with the probe pin provided at the center of the plurality of probe pins in the arrangement direction.

A contact surface of the signal terminal in contact with the probe pin and a contact surface of the two ground terminals in contact with the probe pin may be provided on an approximately same plane. The ground terminal may be a semiconductor substrate to which a ground potential is applied. The signal terminal may be formed at the substantially center of the semiconductor substrate in the arrangement direction by semiconductor process. The signal terminal and the two ground terminals may be made of an inelastic material.

The signal terminal and the two ground terminals are provided such that each contact surface in contact with the probe pins has an angle with the surface of the probe substrate.

The contact terminal for measurement may further include a contact point fixing section to which the signal terminal and the two ground terminals are fixed, and a contact fixing section of which one end is fixed to the contact point fixing section and of which other end is fixed to an external measurement apparatus. The signal terminal and the two ground terminals may be provided such that the contact surface in contact with the probe pins has an angle with the surface of the probe substrate while the other end of the contact fixing section is fixed to the measurement apparatus.

The contact fixing section may include a flat plate section being fixed to the measurement apparatus in substantially parallel with the probe card. The signal terminal and the two ground terminals may be provided such that each contact surface in contact with prove pins has an angle with the flat plane section of the contact fixing section.

The signal terminal and the two ground terminals may project from an edge of the contact point fixing section opposed to the probe pins to the direction toward the probe pins.

A second aspect of the present invention provides a measurement apparatus for a probe card including: a probe substrate; a plurality of probe pins arranged in parallel at a predetermined distance at a predetermined arrangement direction on the surface of the probe substrate and electrically connected to input/output pins of a device under test; and a transmission path of which one end is connected to a testing apparatus and of which other end is connected to the corresponding probe pin, for measuring the signal transmission characteristic of each probe pin and the transmission path. The measurement apparatus includes: a contact terminal for measurement electrically connected to a probe pin of which signal transmission characteristic should be measured among a plurality of probe pins; a position detecting section for detecting the position of the contact terminal for measurement with respect to the probe card; a position control section for controlling the position of the contact terminal for measurement based on the position detected by the position detecting section and electrically connecting the contact terminal for measurement to the probe pin to be measured; and a measurement section for receiving an output signal outputted by the prove pin to be measured and measuring the signal transmission characteristic of the probe pin to be measured and the transmission path corresponding to the probe pin to be measured. The contact terminal for measurement includes: a signal terminal having an width smaller than the distance between the probe pins provided on both sides of one probe pin in the arrangement direction; two ground terminals to which a ground potential is applied, which are provided on both sides of the signal terminal in the arrangement direction and each of which has an width larger than that of the signal terminal in the arrangement direction; and a signal line electrically connecting the signal terminal and a signal input terminal of an external measurement apparatus.

The position control section may hold the contact terminal for measurement such that angles of the signal terminal and the ground terminals in the arrangement direction with a predetermined direction on the surface of the probe card can be adjusted.

The contact fixing section may include a flat plate section being fixed to the measurement apparatus in substantially parallel with the probe card. The signal terminal and the two ground terminals may be provided such that each contact surface in contact with probe pins has an angle with the flat plane section of the contact fixing section.

A fourth aspect of the present invention provides a measurement apparatus provided on the surface of a probe substrate, for measuring the contact resistance of a plurality of probe pins electrically connected to a device under test in a testing apparatus including a main body, a probe substrate and a test head electrically connecting the probe substrate to the main body, for testing the device under test electrically connected to the probe substrate. The measurement apparatus includes: a contact terminal for measurement in contact with a plurality of probe pins including a probe pin of which contact resistance should be measured; a position detecting section for detecting the position of the contact terminal with respect to measurement for the probe substrate; a position control section for controlling the position of the contact terminal for measurement based on the position detected by the position detecting section and for contacting the contact terminal for measurement with the probe pin; and a measurement section for measuring the contact resistance of the probe pin to be measured. The contact terminal for measure includes: a signal terminal having an width smaller than the distance between the probe pins provided on both sides of one probe pin in the arrangement direction, and two ground terminals to which a ground potential is applied, which are provided on both sides of the signal terminal in the arrangement direction, and each of which has an width larger than that of the signal terminal in the arrangement direction. The position control section controls the position of the contact terminal for measurement such that the ground terminals are in contact with the plurality of probe pins including the probe to be measured. The measurement section causes a power supply section provided on the test head to supply a predetermined constant current to the probe pin to be measured through a driver corresponding to the probe pin to be measured among a plurality of drivers provided corresponding to the plurality of probe pins on the test head. The measurement section calculates the contact resistance of the probe pin to be measured based on the voltage value applied from the power supply section to the probe pin to be measured, the voltage value of the ground terminals and the current value of the constant current.

The test head has a plurality of switches provided for each of the plurality of drivers, for switching to provide either of the signal provided by the power supply section or the signal provided by the main body to the corresponding driver. The measurement section may control the plurality of switches to provide the constant current generated by the power supply section to the driver corresponding to the probe pin to be measured and to provide a signal at an approximately zero potential applied from the main body to the driver which is not corresponded to the probe pin to be measured.

The test head may further include a comparator provided corresponding to any probe pin other than the probe pin to be measured in parallel with the driver corresponding to the probe pin, for measuring a voltage value received by the probe pin from the ground terminals. The measurement section may control the driver provided in parallel with the comparator to be in an off-sate and acquire the voltage value measured by the comparator as the voltage value of the ground terminals.

A fifth aspect of the present invention provides a measurement apparatus provided on the surface of the probe substrate, for measuring the positions of a plurality of probe pins electrically connected to a device under test in a testing apparatus including a main body, a probe substrate and a test head for electrically connecting the probe substrate and the main body, for testing the device under test electrically connected to the probe substrate. The measurement apparatus includes: a contact terminal for measurement in contact with the probe pins; a position control section for changing the position of the contact terminal for measurement and scanning the surface of the probe substrate; a position detecting section for detecting the position of the contact terminal for measurement with respect to the probe substrate; and a measurement section for measuring the position of the probe pin to be measured. The contact terminal for measurement includes: a signal terminal having an width smaller than the distance between the probe pins provided both sides of one probe pin in the arrangement direction; two ground terminals to which a ground potential is applied, which are provided on both sides of the signal terminal in the arrangement direction and each of which has an width larger than that of the signal terminal in the arrangement direction; and a signal line for electrically connecting the signal terminal to a signal input terminal of the measurement section. The measurement section causes the power supply section provided on the test head to supply a predetermined minute electric current to the probe pin to be measured through the driver corresponding to the probe pin to be measured among a plurality of drivers provided on the test head corresponding to the plurality of probe pins. The measurement section measures the position of the probe pin to be measured based on the position of the contact terminal for measurement detected by the position detecting section when the signal terminal detects the minute electric current.

The measurement section may cause the driver which is not corresponded to the probe pin to be measured to output a signal at an approximately zero potential. The position control section may sequentially change the position of the contact terminal for measurement in X-axis direction and Y-axis direction which are crossed at right angles in the plane in substantially parallel with the surface of the probe substrate, and in Z-axis direction perpendicular to the surface of the probe substrate. The measurement section may measure the position of the tip of the probe pin to be measured in the X-axis direction, the Y-axis direction and the Z-axis direction.

A sixth aspect of the present invention provides an wafer probe apparatus used for measuring the electrical characteristic of a device under test. The wafer probe apparatus includes: a probe card electrically connecting the device under test; a stage on which the probe card is placed, for controlling the position of the probe card to electrically connect the probe card to the device under test; and a contact terminal for measurement for measuring the characteristic of the probe card. The probe card includes a probe substrate and a plurality of probe pins which are arranged in parallel at a predetermined distance in a predetermined arrangement direction on the surface of the probe substrate and which should be electrically connected to input/output pins of the device under test. The contact terminal for measurement includes: a signal terminal having an width smaller than the distance between the probe pins provided on both sides of one probe pin in the arrangement direction; two ground terminals to which a ground potential is applied, which are provided on both sides of the signal terminal in the arrangement direction and each of which has an width larger than that of the signal terminal in the arrangement direction; and a signal line electrically connecting the signal terminal to a signal input terminal of an external measurement apparatus.

A seventh aspect of the present invention provides a testing apparatus for testing a device under test. The testing apparatus includes: a main body for generating a test signal provided to the device under test and determining pass/fail of the device under test based on an output signal outputted by the device under test based on an output signal outputted by the device under test; a probe card on which a plurality of probe pins electrically connected to the device under test are provided; a test head on which the probe card is placed, for transmitting/receiving a signal between the probe card and the main body; and a measurement apparatus for measuring the characteristic of the probe pins. The probe card has a probe substrate on which the probe pins are provided. The plurality of probe pins are arranged in parallel at a predetermined distance in a predetermined arrangement direction on the surface of the probe substrate. The measurement apparatus includes: a contact terminal for measurement electrically connected to a probe pin of which characteristic should be measured among the plurality of probe pins; a position detecting section for detecting the position of the contact terminal for measurement with respect to the probe card; a position control section for controlling the position of the contact terminal for measurement based on the position detected by the position detecting section to electrically connect the contact terminal for measurement to the probe pin to be measured; and a measurement section for receiving an output signal outputted by the probe pin to be measured through the contact terminal for measurement and measuring the characteristic of the probe pin to be measured based on the output signal. The contact terminal for measurement includes: a signal terminal having an width smaller than the distance between the probe pins provided on both sides of one probe pin in the arrangement direction; two ground terminals to which a ground potential is applied, which are provided on both sides of the signal terminal in the arrangement direction and each of which has an width larger than that of the signal terminal in the arrangement direction; and a signal line electrically connecting the signal terminal and a signal input terminal of a measurement section.

A ground potential may be applied to the probe pin to which the ground terminal is electrically connected. The driver corresponding to the probe pin to which the ground terminal is electrically connected among the plurality of drivers electrically connected to the corresponding probe pin, respectively may output a signal at an approximately zero potential.

The testing apparatus may further include a triaxial moving unit for movably holding the contact terminal for measurement in triaxial directions which are crossed at right angles each other and contacting the contact terminal for measurement with a probe pin to be measured. The measurement section may measure an electrical signal of the tip of the probe pin to be measured through the transmission line connected to the signal terminal and the ground terminals. The transmission line may be a predetermined characteristic impedance of a transmission line. Additionally, the testing apparatus may use a moving stage for controlling the position of the device under test as the triaxial moving unit.

An eight aspect of the present invention provides a contact terminal for measurement electrically contacting plurality of probe pins arranged on the surface of a probe substrate, for measuring the electrical characteristic of the tip of any one of a plurality of probe pins. The contact terminal for measurement includes: a signal terminal having a conductor width enough to be in electrically contact with one probe pin and not enough to be in electrically contact with the other probe pin adjacent to the one probe pin; and a ground terminal having a conductor width or a plane conductor enough to be in electrically contact with a plurality of other probe pins adjacent to the one probe pin. The signal terminal and the ground terminal may be provided on the same plane.

A ninth aspect of the present invention provides a measurement apparatus. The measurement apparatus includes: a contact terminal for measurement according to claim 1 or claim 29; a position control section for moving the contact terminal for measurement to the position at which a plurality of probe pins including a probe pin to be measured is in contacted with the ground terminal; a power supply section for applying a predetermined current from a test head holding a probe substrate to the probe pin to be measured and measuring a first voltage applied to the probe pin; a voltage measurement means for measuring a second voltage applied from the ground terminal to a predetermined probe pin other than the probe pin to be measured among the plurality of probe pins in contact with the ground terminal; and a contact resistance calculating section for calculating the contact resistance between the probe pin to be measured and the signal terminal based on the predetermined current, the first voltage and the second voltage.

The position control section may sequentially contact the ground terminal of the contact terminal for measurement with all the probe pins on the probe substrate. The contact resistance calculating section may calculate the contact resistance for each of the probe pins. The position control section may change a pressing distance for pressing the contact terminal for measurement to calculate the contact resistance of a plurality of different pressing distances for each of the probe pins.

A tenth aspect of the present invention provides a measurement apparatus. The measurement apparatus includes: a contact terminal for measurement according to claim 1 or claim 29; a power supply section for applying a predetermined current from a test head holding a probe substrate to a probe pin to be measured and measuring a voltage applied to the probe pin; a position control section for moving the contact terminal for measurement within a plane in approximately parallel with the surface of the probe substrate at the level of contacting the tip of the probe pin; a position measurement means for calculating the position of the contact terminal for measurement when the probe pin to be measured is in contact with the ground terminal and measuring the position of the tip of the probe pin based on the position.

The power supply section may sequentially apply a predetermined current to the plurality of probe pins. The position measurement section may measure the position for each tip of the plurality of probe pins and measure the relative displacement for each probe pin.

Here, all necessary features of the present invention are not listed in the summary of the invention. The sub-combinations of the features may become the invention.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Figure 1:
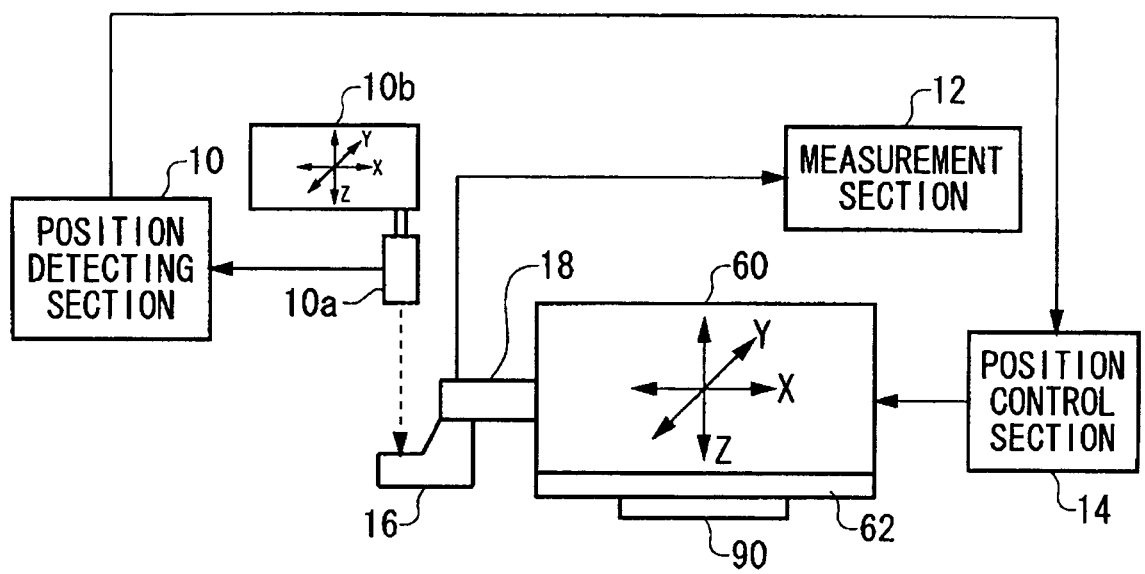
FIG. 1 shows an example of the configuration of a measurement apparatus 100 according to an embodiment of the present invention.
Figure 1:
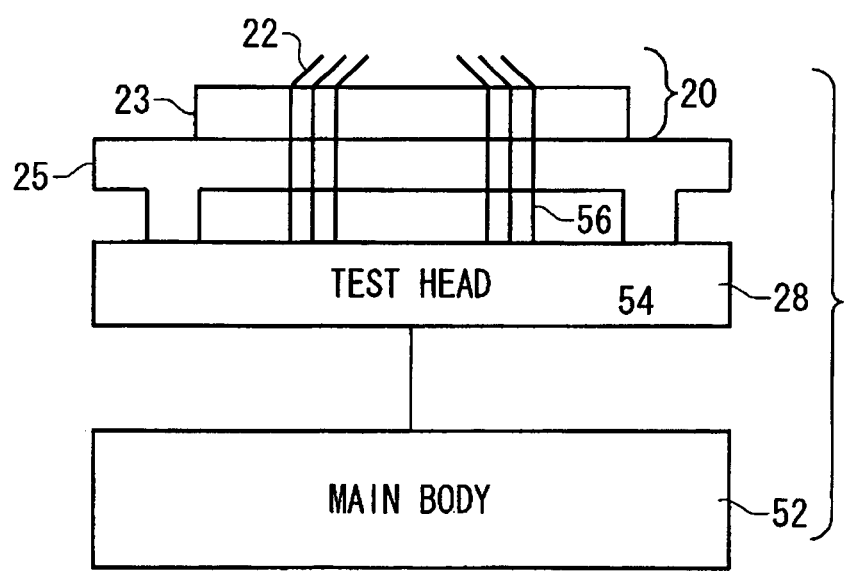

FIG. 1 shows an example of the configuration of a measurement apparatus 100 according to an embodiment of the present invention. The measurement apparatus 100 measures the signal waveform and the electrical characteristic of a probe card 20 included in a testing apparatus 54 for testing such as a semiconductor circuit. Here, a moving stage 60 and an wafer chuck 62 are components of an wafer probe apparatus. The wafer chuck 62 is in vacuum-contact with an wafer 90 to hold the same.

The testing apparatus 54 includes a main body 52, a test head 28, a card holder 25 and a probe card 20. The main body 52 generates a test signal provided to a device under test formed on the wafer 90 and determines pass/fail of the device under test based on the output signal outputted from the device under test. The test head 28 holds the card holder 25 and the probe card and transmits/receives a signal to/from the main body 52.

The card holder 25 replaceably holds and fixes the probe card 20. Additionally, the card holder 25 intermediates to transmit signals between the test head 28 and the probe card 20.

The probe card 20 is in contact with electrodes of the device under test formed on the wafer 90 to transmit/receive electrical signals. The probe card 20 includes a probe substrate 23 and a plurality of probe pins 22. The probe pins 22 are provided on the surface of the probe substrate 23 at the position corresponding to each of a plurality of input/output pins of the device under test. Additionally, each probe pin 22 is connected to the test head 28 through a transmission path 56. Thereby the testing apparatus 54 provides a test signal to the device under test and receives an output signal.

The measurement apparatus 100 includes a position detecting section 10, a measurement section 12, a position control section 14, a contact terminal for measurement 16, a driving section 18 and a moving stage 60. The contact terminal for measurement 16 is provided opposed to the probe substrate 23 and electrically connected to a probe pin of which signal transmission characteristic should be measured among a plurality of probe pins. The contact terminal for measurement 16 can preferably move in the triaxial directions including X-axis, Y-axis and Z-axis directions, which are crossed at right angles each other in order to be in contact with the tip for each of the probe pins 22. For example, the contact terminal for measurement 16 may be attached to the moving stage 60 for moving the wafer 90 in the triaxial directions as shown in FIG. 1. The probe apparatus is configured by the measurement apparatus 100, the probe card 20 and the moving stage 60. When the device under test is tested, the moving stage 60 is in vacuum-contact with the wafer 90 with the wafer chuck (not shown in the figure) to move the wafer 90 in the triaxial directions including X-axis, Y-axis and Z-axis directions, so that the wafer 90 is in contact with the probe card 20.

The position detecting section 10 detects the position of the contact terminal for measurement 16 with respect to the probe card 20. The position detecting section 10 includes a CCD imaging device 10a and a triaxial moving unit 10b. The triaxial moving unit 10b moves the CCD imaging device 10a to a desired position. The CCD imaging device 10a captures an image of the contact terminal for measurement 16. The position detecting section 10 detects the contact terminal for measurement 16 based on the image captured by the CCD imaging device 10a. The CCD imaging device 10a also captures an image of the probe pin 22. The position detecting section 10 detects the position of the probe pin 22, and the relative position between the contact terminal for measurement 16 and the probe pin 22. The triaxial moving unit 10b may be a movement system separated from the moving stage 60. The CCD imaging device 10a may be attached to the contact terminal for measurement 16 at a predetermined position on the moving stage 60.

The position control section 14 controls the position of the contact terminal for measurement 16 based on the position detected by the position detecting section 10 and electrically connects the contact terminal for measurement 16 to the probe pin to be measured. The driving section 18 is fixed to the moving stage 60 and moves to the triaxial direction in conjunction with the movement of the moving stage 60. Additionally, the driving section 18 holds the contact terminal for measurement 16. The moving stage 60 changes the position of the contact terminal for measurement 16 attached to the driving section 18 based on the control signal provided from the position control section 14. Here, the driving section 18 of the present embodiment is attached to the moving stage 60 and moves in conjunction with the movement of the moving stage 60. However, the driving section 18 may have a movement system separated from the moving stage 60 in another embodiment. Additionally, the driving section 18 may be attached to the triaxial moving unit 10b. In the latter case, the relative position between the CCD imaging device 10a and the contact terminal for measurement 16 can be constantly maintained.

The measurement section 12 measures the electrical characteristic of the tip for each of the probe pins, such as a propagation delay timing, an waveform, an waveform quality, an waveform distortion, the waveform quality of the leading edge and the trailing edge, an amplitude, a voltage level and so forth. The measurement section 12 receives the output signal of the tip of the probe pin to be measured through the contact terminal for measurement 16 and measures the signal transmission quality and the electrical characteristic of the end portion from the output end of the test head 28 to the probe pin to be measured through the transmission path 56 based on the output signal. When the signal transmission characteristic is measured, the testing apparatus 54 causes the probe pin to be measured to generate a predetermined signal and causes the other probe pins 22 to generate a ground potential. Here, when the propagation delay timing is measured, the test head 28 provides a reference timing signal to the measurement section 12. For example, the delay time of the signal generated by each probe pin to be measured for the reference timing signal is measured, so that a timing skew for each between the probe pins to be measured can be accurately measured.

Figure 2A:
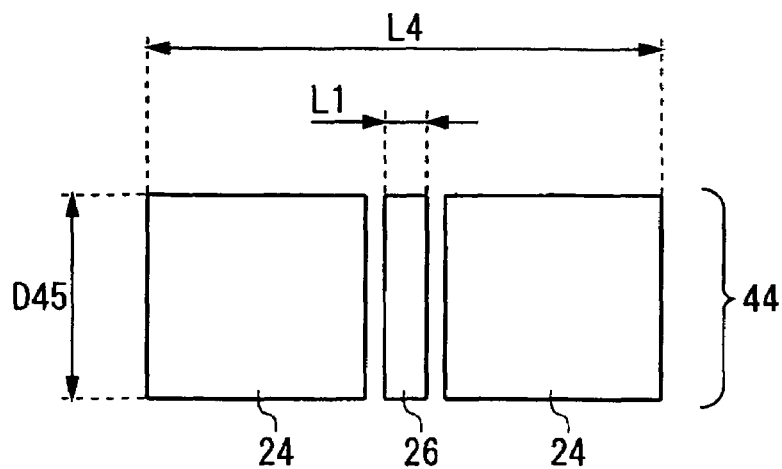
FIG. 2A is a top enlarged view showing an example of the structure of a contact section 44.
Figure 2A:
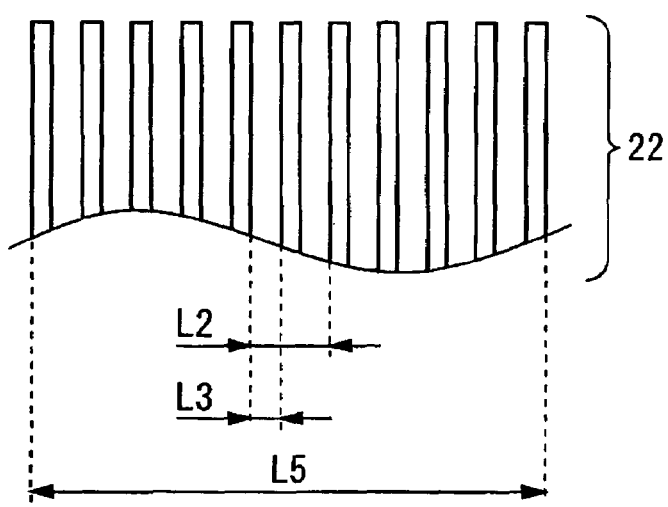
Figure 2B:
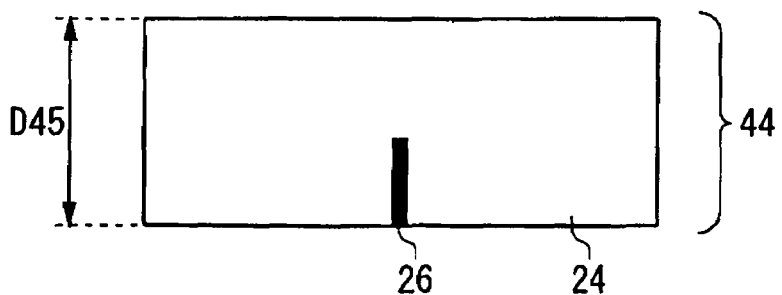
FIG. 2B is a top enlarged view showing another example of the structure of a contact section 44.

FIGS. 2A and 2B are top enlarged views of a contact section 44 included in the contact terminal for measurement 16 and a plurality of probe pins 22. FIG. 2A shows an example of the configuration of the contact section 44. FIG. 2B shows another example of the configuration of the contact section 44.

As shown in FIGS. 2A and 2B, the plurality of probe pins 22 are disposed in parallel at a predetermined distance L3 in a predetermined arrangement direction on the surface of the probe substrate 23. According to the present embodiment, the distance between the probe pins on both sides of one probe pin 22 is L2, and a width of the area in which the plurality of probe pins 22 are provided is L5.

The contact section 44 includes a signal terminal 26 in contact with the probe pin 22 of which transmission characteristic should be measured, and two ground terminals provided on both sides of the signal terminal 26.

An width L1 of the signal terminal 26 in the arrangement direction of the probe pins 22 is at least smaller than the L2. Thereby the signal terminal 26 can be in contact with the one probe pin 22. The width L1 of the signal terminal 26 is preferably smaller than L3. Thereby the signal terminal 26 can be prevented from being in contact with the plurality of probe pins 22. That is to say, the signal terminal 26 has a conductor width enough to be in electrically contact with one probe pin, and not enough to be in electrically contact with the other probe pins while the signal terminal 26 is in contact with the one probe pin.

For example, when the pin pitch (L2-L3) of the probe pin 22 is 100 μm and the distance L3 between the adjacent pins is larger than 50 μm, the width L1 of the signal terminal 26 may be 50 μm.

Each of the ground terminals 24 is larger than the signal terminal 26 and the width for each of the ground terminals 24 is enough to be in contact with the plurality of probe pins 22. For example, each ground terminal 24 has an width larger than the sum of the width of one probe pin 22 and the distance L3 of the probe pins 22. Thereby each of the ground terminals 24 is in contact with the plurality of probe pins 22. That is to say, when the signal terminal 26 is in electrically contact with one probe pin 22, the ground terminals 24 have a conductor width or a plane conductor enough to be in electrically contact with the plurality of probe pins adjacent to the one probe pin 22. Therefore, if any of the plurality of probe pins 22 is a grounding pin, the ground terminals 24 can contact to ground in proximity to the signal terminal 26. Thereby the electrical characteristic of the tip of the probe pin 22 can be appropriately measured.

Figure 8:
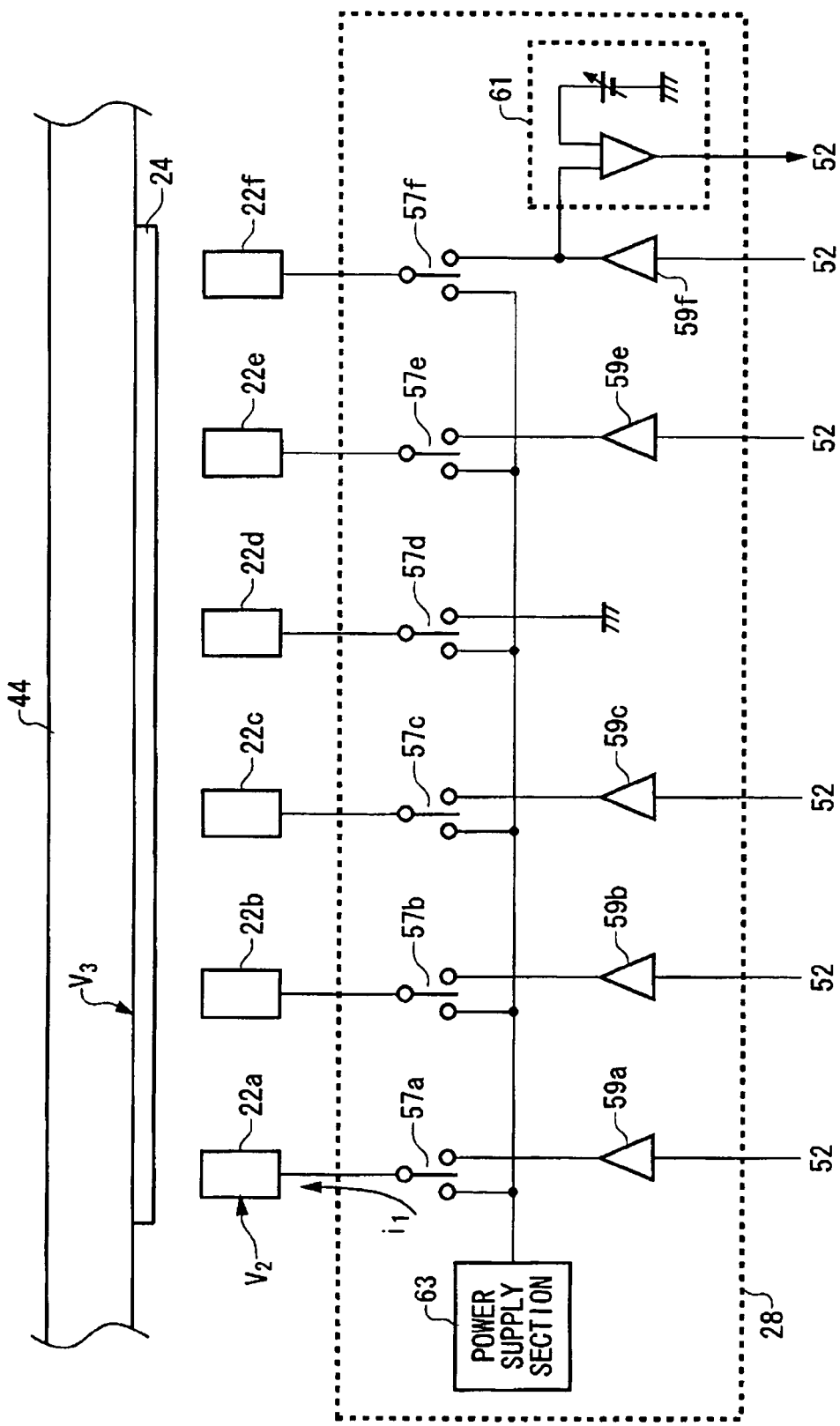
FIG. 8 shows an example of the configuration of a test head 28.

Here, any of the plurality of probe pins 22 might not be actually a grounding pin. However, since drivers 59 connected to the far end side of the plurality of probe pins 22b-22e as shown in FIG. 8 are driven at a zero potential, the potential of the ground terminal 24 is in a low impedance state, so that the electrical characteristic can be practically measured. Here, as another example of the structure of the ground terminals 24, the ground terminals 24 may be provided on only one side of the signal terminal 26, or the ground terminals 24 may be provided on the whole circumference of the signal terminal 26.

Additionally, when the signal terminal 26 is in contact with a probe pin 22 provided at the center of the plurality of the probe pins 22 in the arrangement direction, it is preferred that the ground terminal 24 has width enough to be in contact with all of the plurality of probe pins 22 provided on both sides of the central probe pin 22 in the arrangement direction. That is to say, it is preferred that a width L4 of the contact section 44 is substantially equal to a width L5 of the area in which the plurality of probe pins are provided. For example, when the contact section 44 is in contact with a probe group including sixty-one probe pins, of which pin pith is 100 μm, the width LA of the contact section 44 may be 6100 μm. Thereby if any two probe pins which sandwich the probe pin 22 of which transmission characteristic should be measured are grounding pins, the ground terminal 24 is in contact with at least any grounding pin, so that the ground terminal 24 can detect the ground potential.

Additionally, the width for each of the ground terminals 24 may be substantially equal to the width of the area in which the plurality of probe pins 22 are provided Thereby even if the signal terminal 26 is in contact with any probe pin 22, the ground terminals 24 can be in contact with all of the probe pins 22.

Additionally, it is preferred that the contact surface of the signal terminal 26 in contact with the probe pins 22 and the contact surface of the two ground terminals 24 in contact with the probe pins 22 are provided on substantially the same plane. For example, the signal terminal 26 and the two ground terminals 24 may be formed on the same substrate. Additionally, it is preferred that the signal terminal 26 and the two ground terminals 24 may be made of an inelastic material. Thereby the contact section 44 can be in contact with the plurality of probe pins all together.

FIG. 2B is a top enlarged view showing another example of the contact section 44. In the contact section 44 according to the present embodiment, the signal terminal 26 and the ground terminals 24 are formed on the same substrate. For example, the ground terminals 24 are formed by a semiconductor substrate to which a ground potential is applied, and the signal terminal 26 is formed on substantially the center of the semiconductor substrate by semiconductor process. Additionally, the signal terminal 26 is formed through the semiconductor substrate such that the signal terminal 26 has a predetermined length from the edge opposed to the probe pins 22 of the semiconductor substrate to the direction in substantially parallel with the longitudinal direction of the probe pins 22. In this case, the probe pins each of which width is small can be easily formed.

A plurality of parallel probe pin groups which should be electrically connected to a plurality of device under tests may be provided on the probe substrate 23. At this time, the arrangement direction for each of the probe pin groups might be actually different. Therefore, the driving section 18 preferably holds the contact terminal for measurement 16 such that the angle of the signal terminal 26 and the ground terminals 24 in the arrangement direction with a predetermined direction on the probe substrate 23 can be adjusted in order that the each of the probe pin groups is in contact with the contact terminal for measurement 16. That is to say, the driving section 18 holds the contact terminal for measurement 16 such that the arrangement direction of the signal terminal 26 and the ground terminals 24 can be in substantially parallel with the arrangement direction of each of the probe pin groups.

Figure 3A:
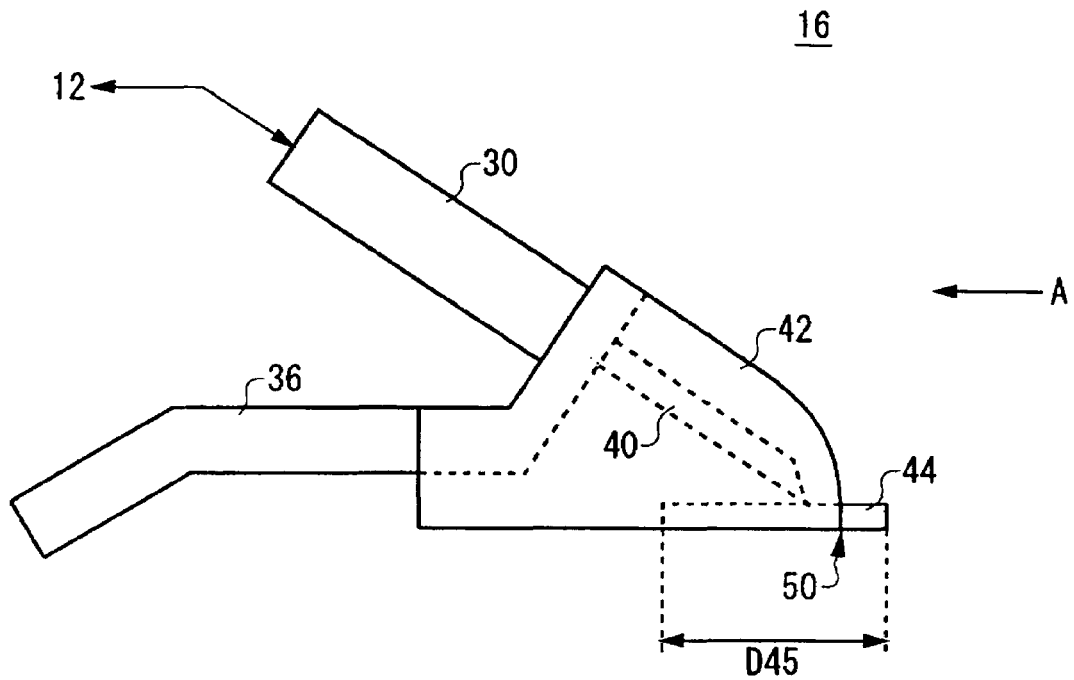
FIG. 3A shows an example of a side view of a contact terminal for measurement 16.
Figure 3B:
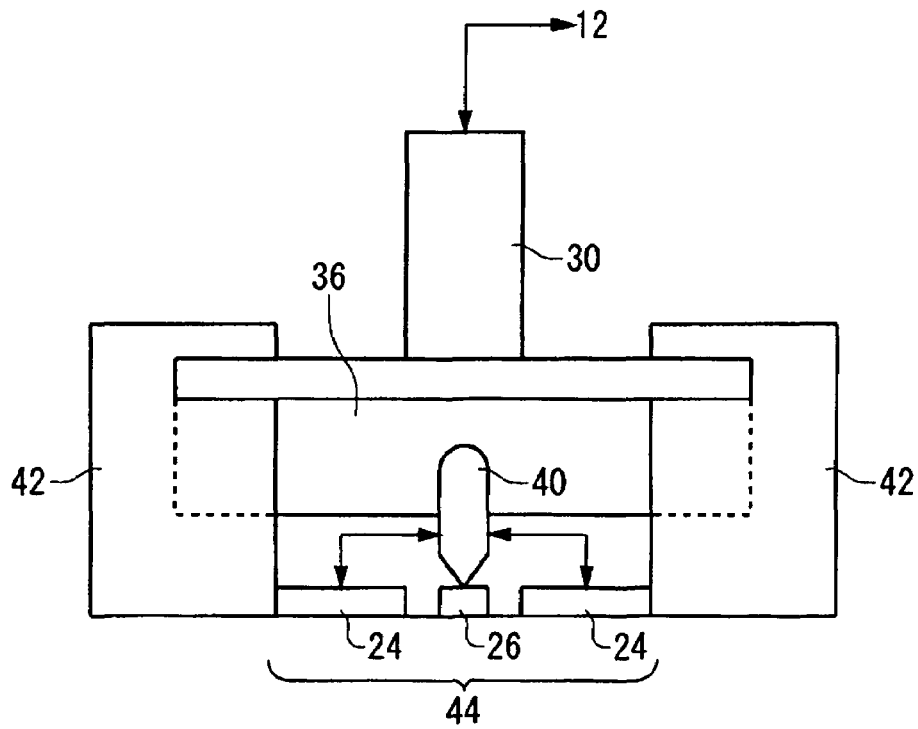
FIG. 3B shows an example of a front view of the contact terminal for measurement 16 in the direction A of FIG. 3A.

FIGS. 3A and 3B show an example of the configuration of the contact terminal for measurement 16. FIG. 3A shows a side view of the contact terminal for measurement 16, and FIG. 3B shows a front view of the contact terminal for measurement 16 in the direction A of FIG. 3A.

The contact terminal for measurement 16 includes a coaxial cable 30, a contact point fixing section 42, a contact fixing section 36, a coaxial terminal 40 and a contact section 44. The contact section 44 is in contact with the probe pins 22. The coaxial cable 30 is a signal line for electrically connecting the measurement section 12 to the contact section 44. The coaxial terminal 40 is extended from the coaxial cable 30 and is electrically connected to the contact section 44. Thereby the signal line of the coaxial cable 30 is connected to the signal terminal 26, and an earthing conductor is connected to the ground terminals 24.

The contact point fixing section fixes the contact section 44. For example, the contact point fixing section 42 includes a bottom section on which the contact section 44 is placed, and an extension section which extends upward from both ends of the bottom section. The contact point fixing section 42 fixes the contact section 44 by sandwiching both sides of the contact section 44 by extension sections on both ends thereof. The contact section 44 projects from the edge 50 of the contact point fixing section 42 opposed to the probe pins 22 to the direction toward the probe pins 22 and is fixed.

The contact fixing section 36 is in the form of a plate. One end of the contact fixing section 36 is fixed to the contact point fixing section 42 and the other end of that is fixed to the driving section 18. Thereby the contact terminal for measurement 16 is fixed to the driving section 18. Additionally, the contact fixing section 36 holds the coaxial cable 30. a through-hole through which the coaxial terminal 40 of the coaxial cable 30 is received is formed in the contact fixing section 36. The coaxial terminal 40 is in contact with the contact section 44 through the through-hole.

Figure 4:
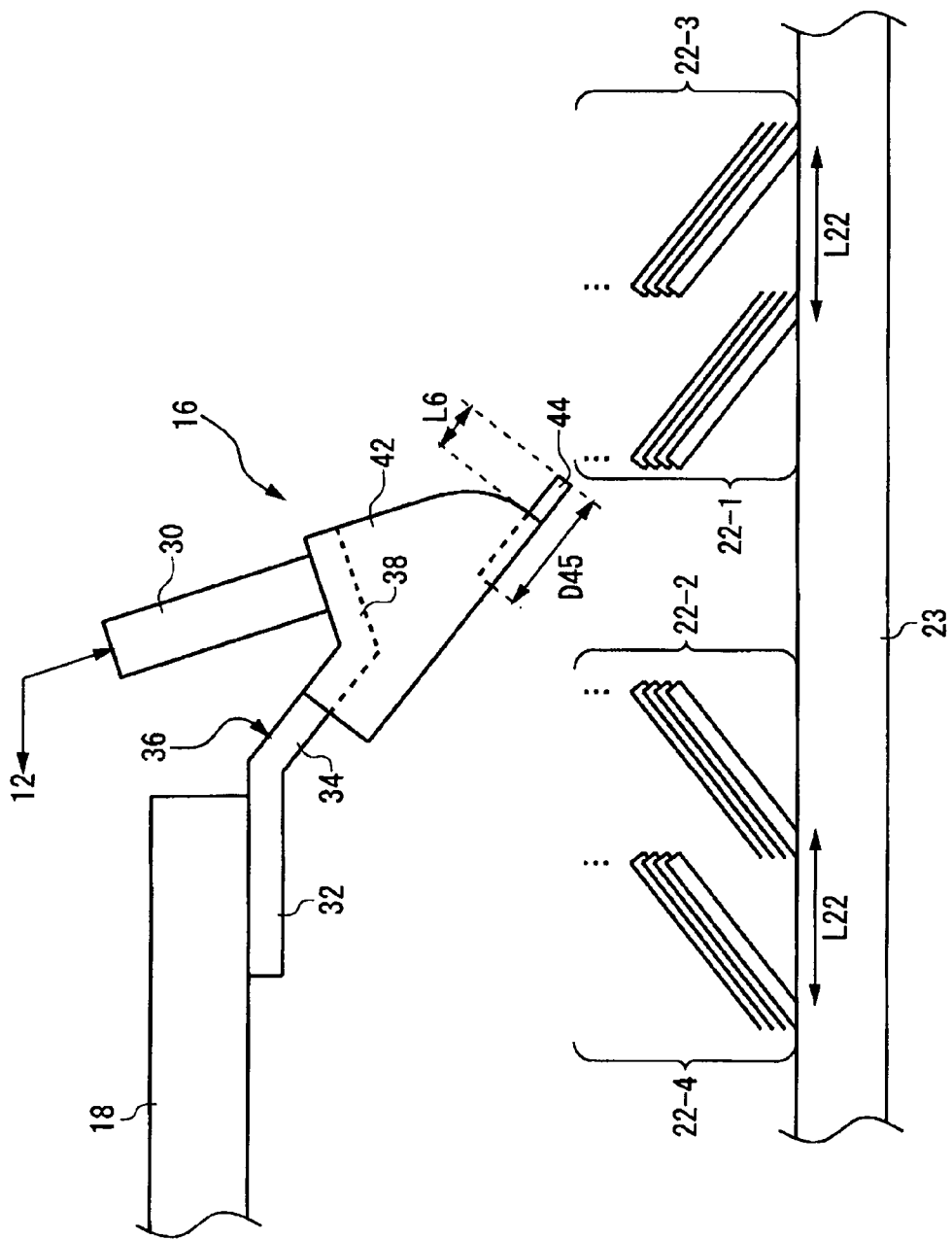
FIG. 4 shows the contact terminal for measurement 16 fixed to a driving section 18.

FIG. 4 shows the contact terminal for measurement 16 fixed to a driving section 18. The probe pins 22 are provided at an angle with the surface of the probe substrate 23. Therefore, it is preferred that the contact section 44 of the contact terminal for measurement 16 is provided such that the surface in contact with the probe pins 22 has an angle with the surface of the probe substrate 23. In this case, it is preferred that the contact terminal for measurement 16 is fixed to the driving section 18 such that the angle between the surface of the probe substrate 23 and the contact surface of the contact section 44 is approximately equal to the angle between the surface of the probe substrate 23 and the probe pins 22.

The contact fixing section 36 includes a flat plate section 32, an extension section 34 and a cable fixing section 38. The driving section 18 has a plane section in substantially parallel with the surface of the probe substrate 23. The flat plate section 32 is fixed to the plane section. The extension section 34 extends from the flat plate section 32 to the direction of the probe substrate 23 and has a predetermined angle with the flat plate section 32. The bottom surface of the contact fixing section 42 is provided in substantially parallel with the extension section 34. The contact section 44 is provided in substantially parallel with the bottom surface. Therefore, the contact section 44 is provided such that the contact surface in contact with the probe pins 22 has an angle with the flat plate section 32. Thereby when the contact terminal for measurement 16 is in contact with a probe pin group 22-1, the contact terminal for measurement 16 can be prevented from being in contact with the other probe pin group 22-2.

When the flat plate section 32 is fixed to the driving section 18, the extension section 34 preferably extends with an angle with the flat plate section 32 such that the angle of the contact section 44 is approximately equal to the angle of the probe pin 22. The cable fixing section 38 further extends from the extension section 34 and fixes the coaxial cable 30.

A length L6 for which the contact section 44 projects from the contact point fixing section 42 is preferably enough to keep connected to the probe pins 22 even if the probe pins 22 are in contact with the contact section 44 and then the probe pins 22 are curved.

Figure 5:
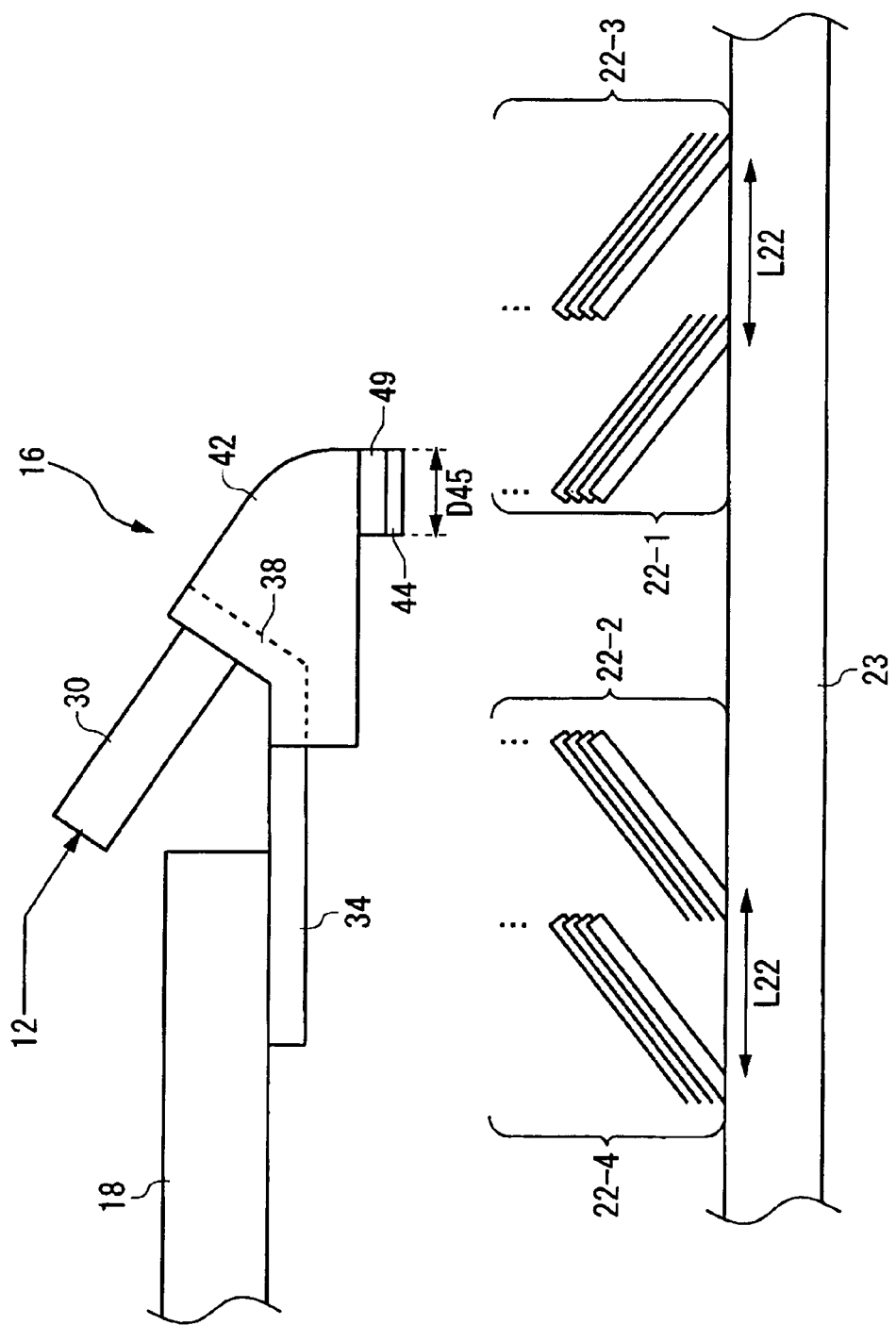
FIG. 5 shows another example of the contact terminal for measurement 16 fixed to the driving section 18.

FIG. 5 shows another example of the contact terminal for measurement 16 fixed to a driving section 18. The contact section 44 of the contact terminal for measurement 16 according to the present embodiment has a contact surface in substantially parallel with the surface of the probe substrate 23. Thereby the transmission characteristic for each of the probe pins can be measured under the contact condition substantially the same as the case that the testing apparatus 54 tests an wafer under test.

The contact fixing section 36 according to the present embodiment does not have the flat plane section 32 and is fixed to the driving section 18 on the extension section 34. The extension section 34 has a plane in substantially parallel with the bottom surface of the contact point fixing section 42 and is fixed to the driving section 18 on the plane. Thereby the bottom surface of the contact point fixing section 42 is held in substantially parallel with the surface of the probe substrate 23. The contact section 44 is fixed to a step section 49, and the step section 49 is fixed to the contact point fixing section 42. The step section 49 and the contact section 44 may be formed by the same semiconductor substrate. For example, the contact section 44 may be a pattern formed on the rear surface of the semiconductor substrate. Additionally, the contact section 44 and the coaxial cable 30 are electrically connected through a through-hole formed in the step section 49.

Thereby the portions other than the contact section 44 of the contact terminal for measurement 16 can be prevented from projecting lower than the contact surface of the contact section 44. Therefore, when the contact section 44 is in contact with the probe pins group to be measured, any portion other than the contact surface can be prevented from being in contact with the other probe pin groups. For example, a plurality of probe pins (22-1-22-4) are formed on the surface of the probe substrate 23 at a predetermined distance L22. Even if the height of the contact point fixing section 42 in the arrangement direction of the plurality of probe pin groups is larger than the distance L22, the contact point fixing section 42 can be prevented from being in contact with any probe pin groups other than the probe pin group to be measured by forming the step section 49. The thickness of the step section 49 is preferably larger than the fluctuation band of the height of the probe pins 22 in the vertical direction on the probe substrate, which is generated in the case that the probe pins 22 are pressed by the contact terminal for measurement 16 and curved.

The driving section 18 preferably has means for adjusting an angle to hold the contact terminal for measurement 16 such that the contact surface of the contact section 44 is in substantially parallel with the surface of the probe substrate 23. Thereby the probe pin 22 for each of the probe pins to be measured can be evenly pressed. For example, the position detecting section 10 described with reference to FIG. 1 may detect the angle of the contact surface of the contact section 44, and the driving section 18 may adjust the angle to hold the contact terminal for measurement 16 based on the detected angle.

Figure 6A:
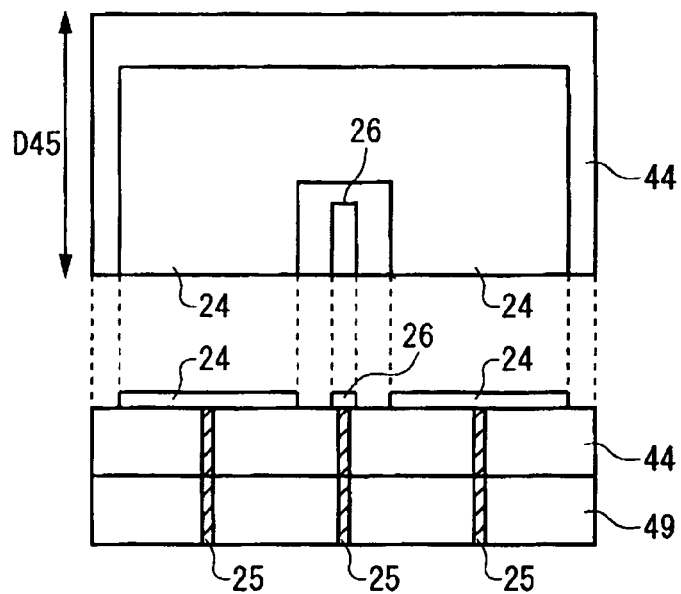
FIG. 6A shows an example of the structure of the contact section 44.
Figure 6B:
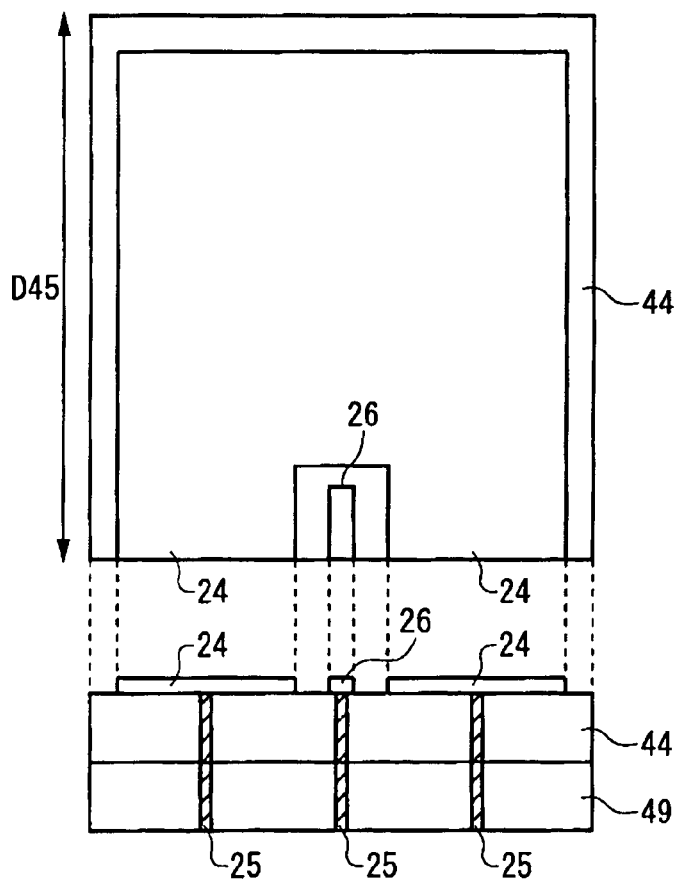
FIG. 6B shows another example of the structure of the contact section 44.

FIG. 6A and FIG. 6B show examples of the structure of the contact section 44. FIG. 6A and FIG. 6B show a bottom view and a front view of the contact section 44. In the contact section 44, the ground terminals 24 and the signal terminal 26 are formed on the bottom surface opposed to the probe substrate 23. The contact section 44 is a semiconductor substrate, and the ground terminals 24 and the signal terminal 26 are formed by semiconductor process.

As shown in FIG. 6A and FIG. 6B, the signal terminal 26 extends from substantially the center of the edge in parallel with the arrangement direction of the probe pins 22 on the substrate of the contact section 44 to the direction perpendicular to the edge within the substrate. The ground terminals 24 are provided substantially all over the surface of the substrate. The ground terminals 24 are provided on one side of the substrate on which the signal terminal 26 is formed at a predetermined distance with the signal terminal 26 such that the ground terminals 24 surrounds three sides of the signal terminal 26 other than the one side.

Though-holes 25 through which the signal terminal 26 and the ground terminals 24 are electrically connected to the coaxial cable 30 are formed through the substrate of the contact section 44 and the step section 49. The signal line and the earthing conductor of the coaxial cable 30 are connected to the signal terminal 26 and the ground terminals 24 through the through-holes 25.

Additionally, as shown in FIG. 6B, the contact section 44 may have a long height D45. For example, the height D45 may be larger than the distance L22 between the probe pin groups described with reference FIG. 5. Thereby the contact section 44 can be in contact with a plurality of probe pin groups. Therefore, if any of the plurality of probe pins 22 is a grounding pin, the ground terminals 24 can be in contact with the grounding pin. Additionally, if the plurality of probe pin groups include a plurality of grounding pins, the ground terminals 24 can be in contact with more grounding pins. Here, it is preferred that a yawing correction function being capable of a minute angular displacement on the contact plane of the contact section 44 is provided.

Figure 7A:
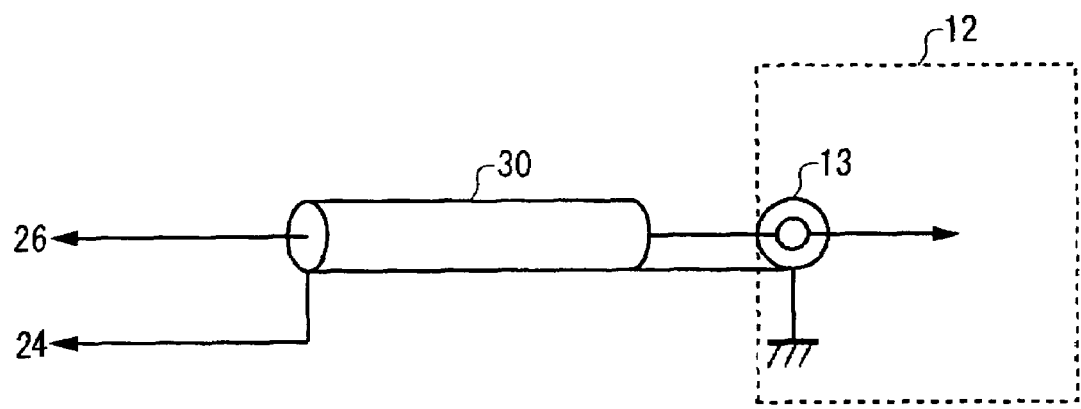
FIG. 7A is an explanatory diagram of an example of an electrical connection between the contact terminal for measurement 16 and a measurement section 12.

FIG. 7 is an explanatory diagram of an example of an electrical connection between the contact terminal for measurement 16 and a measurement section 12. As shown in FIG. 7A, the contact terminal for measurement 16 and the measurement section 12 are electrically connected through the coaxial cable 30. In this case, the signal line is connected to the signal terminal 26 at one end of the coaxial cable 30, and the earthing conductor is connected to the ground terminals 24. Additionally, the other end of the coaxial cable 30 is connected to an input terminal 13 of the measurement section 12, and the signal received from the contact terminal for measurement 16 is transmitted to the measurement section 12.

Figure 7B:
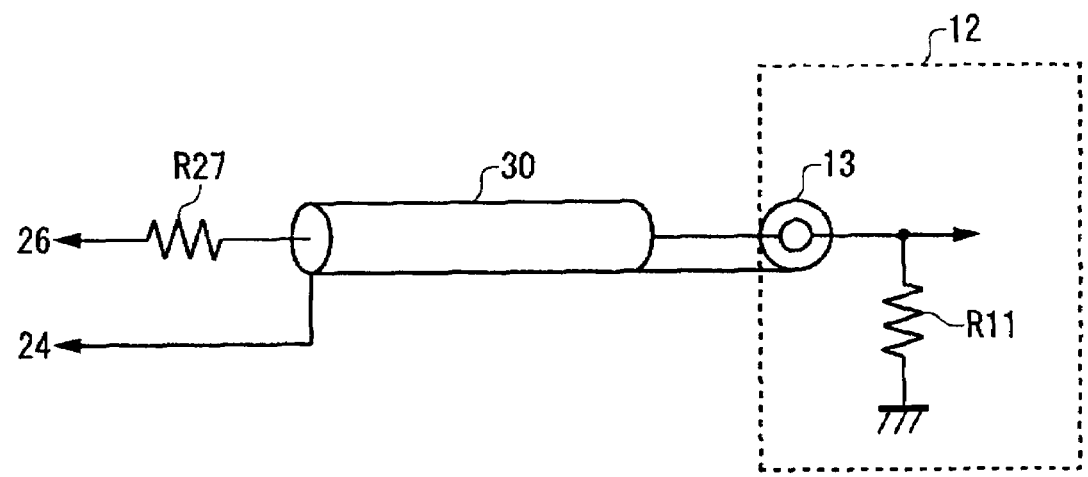
FIG. 7B is an explanatory diagram of another example of an electrical connection between the contact terminal for measurement 16 and the measurement section 12.

According to another embodiment as shown in FIG. 7B, a resistance R27 is provided between the signal terminal 26 and the signal line of the coaxial cable 30, and the input terminal of the measurement section 12 may be terminated at a resistance R11. The ohmic value of the resistance R27 is 450 ohm or 495 ohm, and the ohmic value of the resistance R11 is 50 ohm, for example. Due to such resistance, the signal transmission path has $\frac{1}{10}$ or $\frac{1}{100}$ of attenuation characteristic. Preferably, capacitors for compensating waveform are provided at both ends of the resistance R27. Therefore, the connection to the probe pin 22 being the measuring object in a high impedance state can be achieved, so that the waveform transmitted by the probe pins 22 can be more accurately measured. Particularly, fast pulse with a precipitous waveform can be more accurately measured.

The measurement apparatus 100 may include an input terminal with dual channel for receiving the transmission path shown in FIG. 7A and FIG. 7B and may also include two contact terminal for measures 16. In this case, the measurement apparatus 100 can perform a measurement with an appropriate waveform quality corresponding to the waveform to be measured.

Next, an example of measuring the contact resistance of the probe pins 22 will be described. FIG. 8 shows an example of the configuration of the test head 28. The test head 28 includes a plurality of switches 57a-57f, hereinafter generally referred to as 57, a plurality of drivers 59a-59f, hereinafter generally referred to as 59, a comparator 61 and a power supply section 63. In the present embodiment, the probe pins 22a-22f are connected to the ground terminals 24. The power supply section 63 may be a current source and voltage measurement apparatus (ISVM). Here, a number of I/O channels (e.g. combination of the driver 59f and a comparator 61) connected to IC terminals of the device under test and dedicated channels for drivers (driver 59a-59e) are provided on the test head 28.

The plurality of drivers 59 are provided corresponding to each of the plurality of probe pins 22 and provide the signal received from the main body 52 to each corresponding probe pin 22. Here, a probe pin 22d according to the present embodiment is a grounding pin, and a ground potential is applied thereto.

The plurality of switches 57 are corresponded to the plurality of probe pins 22, and each of the plurality of switches 57 is provided between the corresponding probe pin 22 and the corresponding driver 59. Each of the switches 57 switches between the corresponding driver 59 or the power supply section 63 to which the corresponding probe pin 22 is connected. The plurality of switches 57 may be controlled by the main body 52. The comparator 61 is provided on any of the plurality of probe pins 22 other than the probe pin to be measured 22a in parallel with the drivers 59, and measures the voltage value of the signal received by the corresponding probe pin 22 from outside. The comparator 61 according to the present embodiment measures the voltage value received by the corresponding probe pin 22 from the ground terminals 24.

The measurement apparatus 100 according to the present invention controls the testing apparatus 54 and measures the contact resistance for each of the probe pins 22a-22f provided on the probe substrate 23. For example, the testing apparatus 54 receives information indicating that the measurement section 12 measures the contact resistance of any of the probe pins 22a-22f from the measurement section 12, so that the testing apparatus 54 is controlled. The position control section 14 controls the position of the contact terminal for measurement 16 such that the ground terminals 24 are in contact with the plurality of probe pins 22 including the probe pin to be measured.

The position control section 14 may control the position of the contact terminal for measurement 16 such that the ground terminals 24 of the contact terminal for measurement 16 are sequentially in contact with all of the probe pins 22 provided on the probe substrate 23. For example, when the contact resistance of all the probe pins 22 in contact with the ground terminals 24 are measured, the position of the contact terminal for measurement 16 may be changed and the ground terminals 24 may be in contact with a probe pin group which has not been measured.

When the contact resistance of the probe pin 22a is measured, the switch 57a connects the probe pin 22a to the power supply section 63. The other switches 57 connect the corresponding probe pins 22 to the drivers 59, respectively. The main body 52 causes the drivers 59b-59e which are not corresponded to the probe pin to be measured to generate a zero potential and controls the driver 59 to be in an off-sate.

The measurement section 12 causes the power supply section 63 to supply a predetermined constant current i1 to the probe pin 22a through the switch 57a corresponding to the probe pin to be measured 22a. In this case, the constant current i1 is applied to the other probe pin 22 through the ground terminals 24 and applied to the ground potential by the drivers 59b-59e.

Additionally, the measurement section 12 functions as a contact resistance calculating means for calculating the contact resistance of the probe pin to be measured 22a based on the voltage value applied to the probe pin to be measured by the power supply section 63, the voltage value of the ground terminals 24 and the current value of the constant current i1. For example, the voltage value applied from the power supply section 63 to the probe pin 22a is a first voltage V2, and the voltage value of the ground terminals 24 is a second voltage V3, the contact resistance of the probe pin 22a can be calculated by the following formula: (V2−V3)/i1.

The voltage V2 of the probe pin 22a is approximately equal to the voltage applied by the power supply section 63. The power supply section 63 may notify the measurement section 12 of the applied voltage value V2 and the applied current value i1. Additionally, since the driver 59f is in an off-sate, any current is not applied from the ground terminals 24 to the probe pin 22f. Therefore, the voltage value V3 can be measured by the comparator 61. That is to say, the comparator 61 functions as a voltage measurement means. The measurement section 12 may obtain the voltage value measured by the comparator 61 as the voltage value V3 of the ground terminals 24.

The comparator 61 can specify the voltage value V3 by detecting the output state of the comparator 61 as changing the comparison voltage. Then, the voltage value V3 can be detected and notified to the measurement section 12. Thereby the contact resistance of the probe pin 22a can be accurately measured. Additionally, the contact resistance of the other probe pins 22 can be measured in the same way. Specifically, the switch 57 is controlled, the probe pin to be measured 22 is connected to the power supply section 63, and the other probe pins 22 is connected to the ground potential by the driver 59.

Next, it will be described that an example of determining pass/fail of the contact resistance of all the probe pins 22. Here, the allowed value for the contact resistance might be actually different among all the probe pins 22. For example, the output terminal of the device under test needs the contact resistance lower than 1 ohm, however, as for the input terminal, the contact resistance higher than such as 10 ohm may be permitted. Additionally, as for a power-supply pin and a grounding pin including a plurality of pins, the sum of the contact resistance may have to be less than 0.1 ohm.

Thus, for each kind of device under test, or for a predetermined group of a plurality of pins, means for previously setting each allowable contact resistance Rmax and saving the same is provided. Then, after all the probe pins 22 are measured, the contact resistance for each probe pin measured in the above-described measurement is compared with the allowance contact resistance value Rmax corresponding to each probe pin. If the contact resistance is larger than the allowance contact resistance value Rmax, it is determined that the probe pin 22 is failed. Thereby the life time of the probe card 20 can be extended. Here, the contact resistance value obtained by the above-described measurement can be used to determine a time at which the probe card should be replaced.

Next, an example of measuring the press characteristic of the probe pins 22 will be described. The press characteristic of the probe pins 22 can be measured by sequentially changing a distance between the contact terminal for measurement 16 and the probe substrate 23 in the press direction (pressing distance) and measuring the contact resistance of the probe pins 22 more than once. The pressing force against the probe pins 22 is changed dependent on the pressing distance. The pressing distance can be controlled by adjusting the position of the contact terminal for measurement 16 by the position control section 14. It can be checked that the contact portion of the probe pins 22 is deteriorated based on the measurement result of the contact resistance value for each pressing distance.

Additionally, the hysteresis characteristic of the contact resistance with respect to the pressing force can be measured by firstly measuring the contact resistance as gradually increasing the pressing distance to the probe pins 22, and secondly measuring the contact resistance as gradually decreasing the pressing distance to the probe pins 22. Thus, information for determining the deterioration characteristic of the contact portion of the probe pins 22 can be obtained by measuring the hysteresis characteristic.

Additionally, it can be checked that the reliability of the electrical connection of the probe pins 22 and any residual substance adhered on the contact portion by repeating the following steps: measuring the contact resistance of the probe pins 22; releasing the pressing force against the probe pins 22; and measuring the contact resistance of the probe pins 22 again. Here, the contact resistance of the probe pins 22 can be measured every a predetermined period. Then, the measurement result is accumulated, therefore, the timewise deterioration and the singular point of the deterioration of the probe pins 22 can be specified. Thereby the probe pins 22 can be replaced and cleaned at the appropriate intervals.

Figure 9:
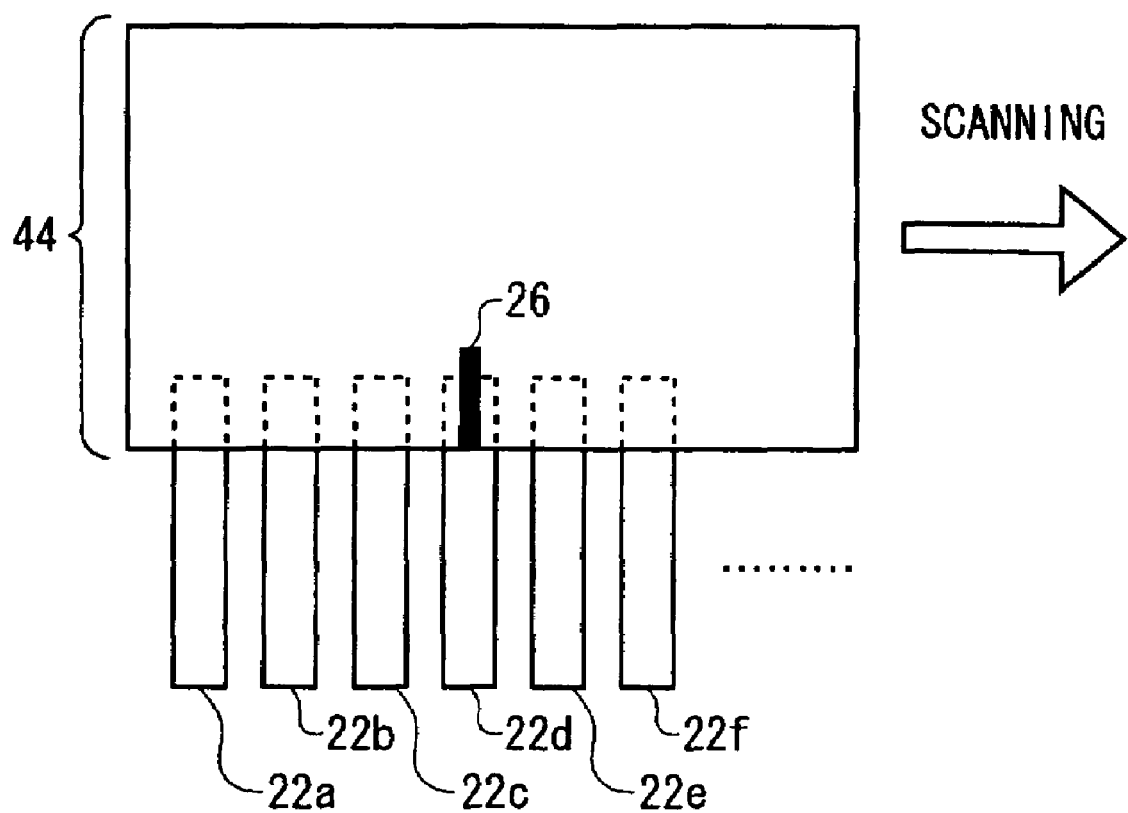
FIG. 9 is a top view in the direction perpendicular to the surface of a probe substrate 23.
Figure 10A:
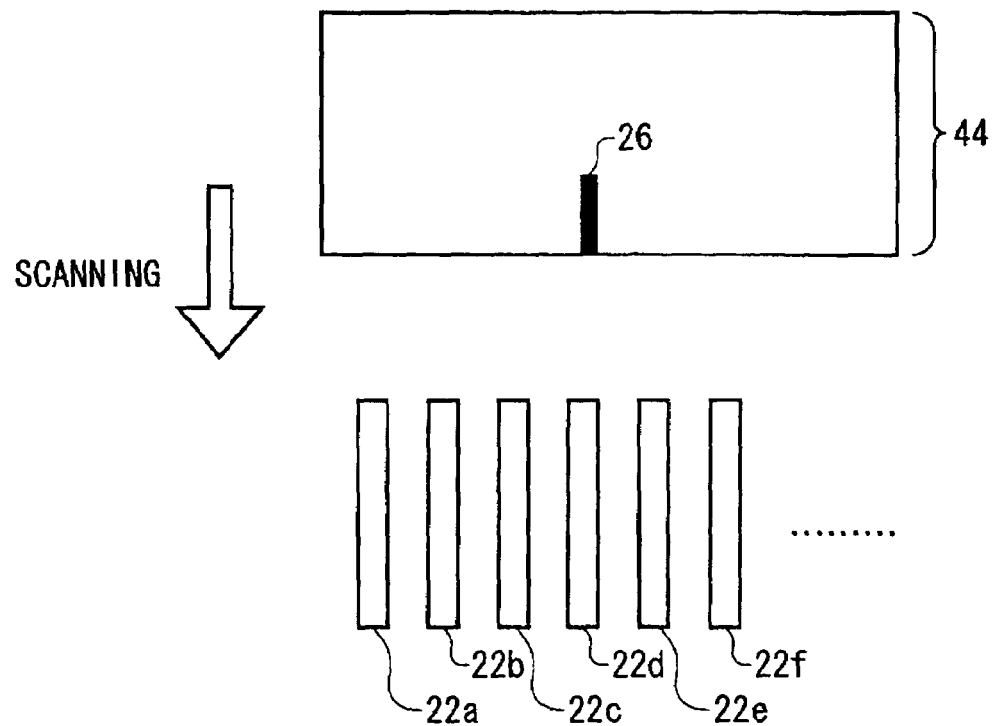
FIG. 10A shows an example of a top view in the direction perpendicular to the surface of the probe substrate 23.
Figure 10B:
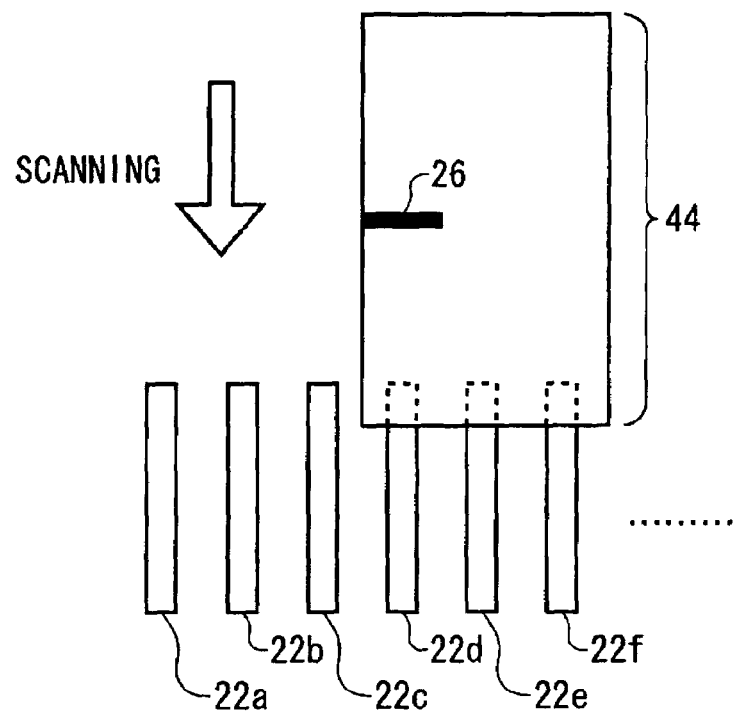
FIG. 10B shows another example of a top view in the direction perpendicular to the surface of the probe substrate 23.
Figure 11:
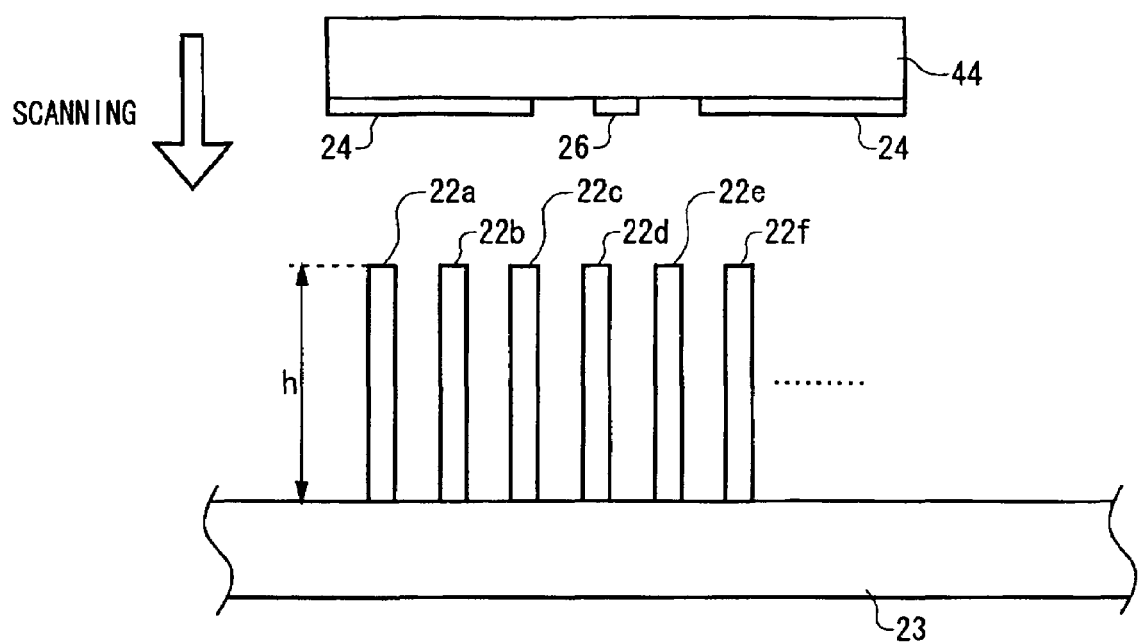
FIG. 11 is a side view in the direction perpendicular to the side surface of the probe substrate 23.

Next, a measurement of physical displacement of the probe pins 22 will be described. FIG. 9-FIG. 11 show examples of a method of measuring the position of the probe pins 22 using the contact terminal for measurement 16. FIG. 9 and FIG. 10 are top views in the direction perpendicular to the surface of the probe substrate 23. FIG. 11 is a side view in the direction perpendicular to the side surface of the probe substrate 23.

When the position of the probe pin 22 is measured, the power supply section 63 described with reference to FIG. 8 provides a voltage signal limited to the minute current to the probe pin to be measured 22. Then, the position control section 14 described with reference to FIG. 1 changes the position of the contact terminal for measurement 16 and scans the surface of the probe substrate 23. It is preferred that the position control section 14 can move the contact terminal for measurement 16 to the X-axis direction and Y-axis direction which are crossed at right angles on the plane in parallel with the surface of the probe substrate 23, respectively and can move the contact terminal for measurement 16 to the Z-axis direction perpendicular to the surface of the probe substrate 23.

The measurement section 12 detects the voltage signal of the power supply section 63 transmitted to the contact terminal for measurement 16 for each position of the contact terminal for measurement 16. That is to say, when the signal terminal 26 of the contact terminal for measurement 16 is in contact with the probe pin to be measured 22, the measurement section 12 detects the voltage signal. Therefore, positional information that the position control section 14 controls to move the probe pins 22 from the X-axis direction to the Y-axis direction provides the region from which the probe is detected thereby the center location of the probe pin 22 can be specified. Additionally, the voltage signal can be detected by utilizing the contact between the probe pin 22 and the ground potential. In this case, the voltage signal can be detected based on the voltage change that the output voltage of the power supply section 63 is around zero.

Specifically, design information on the placement of each probe pin 22 on the surface of the probe substrate 23 is provided to the position control section 14. Then, the position control section 14 moves the contact terminal for measurement 16 near the probe pin 22 of which position should be measured based on the design information.

Next, the position control section 14 moves the contact terminal for measurement 16 along the arrangement direction (X-axis direction) of the probe pins 22 among the probe pin group as shown in FIG. 9 to detect the position of the probe pin 22 to be measured in the X-axis direction. When the contact terminal for measurement 16 is moved along the x-axis direction, it is preferred that the position control section 14 controls the orientation of the contact terminal for measurement 16 such that the longitudinal direction of the signal terminal 16 is in parallel with the longitudinal direction of the probe pins 22. Thereby the signal terminal 26 can be prevented from being in contact with the plurality of probe pins 22 at the same time, and the position of the probe pin 22 to be measured can be accurately measured. The longitudinal direction of the probe pins 22 may be distinguished based on the design information.

next, the position control section 14 controls the position of the contact terminal for measurement 16 to dispose the signal terminal 26 at the position in the detected X-axis direction. Then, the position control section 14 moves the contact terminal 16 along the Y-axis direction perpendicular to the X-axis direction as shown in FIG. 10 to detect the position of the probe pin 22 to be measured in the Y-axis direction. In this case, the position control section 14 may control the orientation of the contact terminal for measurement 16 such that the longitudinal direction of the signal terminal 26 is in substantially parallel with the longitudinal direction of the probe pin 22 as shown in FIG. 10A. Additionally, the position control section 14 may also control the orientation of the contact terminal for measurement 16 such that the longitudinal direction of the signal terminal 26 is substantially perpendicular to the longitudinal direction of the probe pin 22 as shown in FIG. 10B.

When the contact terminal for measurement 16 is moved to the X-axis direction and the Y-axis direction, the position control section 14 preferably controls the position of the contact terminal for measurement 16 in the Y-axis direction such that the signal terminal 26 is in contact with the tip of the probe pins 22. For example, the position control section 14 may move the contact terminal for measurement 16 within the plane in substantially parallel with the surface of the probe substrate 23 at a level at which the contact terminal for measurement 16 is in contact with the tip of the probe pins 22. The level of the tip of the probe pins 22 in the Y-axis direction may be distinguished based on the design information. Additionally, even if the probe pins are transformed with age and the position of the tip of the probe pins 22 in the Y-axis direction is lower than the design value, the position control section 14 may control the position of the contact terminal for measurement 16 such that the signal terminal 26 is disposed at the position lower than the position of the tip of the probe pins 22 in the Y-axis direction, which is distinguished based on the design information in order to contact the signal terminal 26 with the probe pin 22.

Next, the position control section 14 controls the position of the contact terminal for measurement 16 to dispose the signal terminal 26 at the position in the detected X-axis direction and Y-axis direction. Then, the position control section 14 moves the contact terminal for measurement 16 along the Z-axis direction such that the distance between the signal terminal 26 and the probe pins 22 is smaller as shown in FIG. 11 to detect the position of the probe pin 22 to be measured in the Z-axis direction. The position control section 14 stops moving the contact terminal for measurement 16 when the measurement section 12 detects the minute current. Thereby the probe pins 22 can be prevented from applying excessive pressing force to the probe pins 22 and detect the position of the tip of the probe pins 22 in the Z-axis direction.

Additionally, the position control section 14 may control the position of the contact terminal for measurement 16 using a binary search method when the positions of the probe pins 22 are detected. Thereby the number of times of movement of contact terminal for measurement 16 is reduced so that the position of the probe pins 22 can be efficiently detected.

The above-described measurement is performed on all the probe pins 22 to be measured, so that three-dimensional positional information on the tip of all the probe pins 22 can be obtained. In this case, the power supply section 63 sequentially applies the voltage signal limited to the minute constant current to all the probe pins 22 to be measured, and the measurement section 12 may measure each position of the tip of the probe pin 22 to be measured and function as a position measurement means for measuring the relative displacement of each probe pin 22. When the device under test is tested using the probe card 20, the device under test can be accurately connected to the probe pins 22 by using the positional information. Additionally, when the device under test is tested, the amount of stroke for pressing the device under test against the probe pins 22 can be accurately adjusted based on the flatness of the tip for each of the probe pins 22.

Additionally, accumulating the positional information obtained by the above-described measurement for a long time, three-dimensional transition information on the timewise change of the probe pins 22 can be obtained, so that the transform and deterioration of the shape of the probe pins 22 can be specified. Thereby the contact failure in testing the device under test can be previously reduced. Additionally, the replacement time of the probe pins 22 can be appropriately determined.

Figure 12:
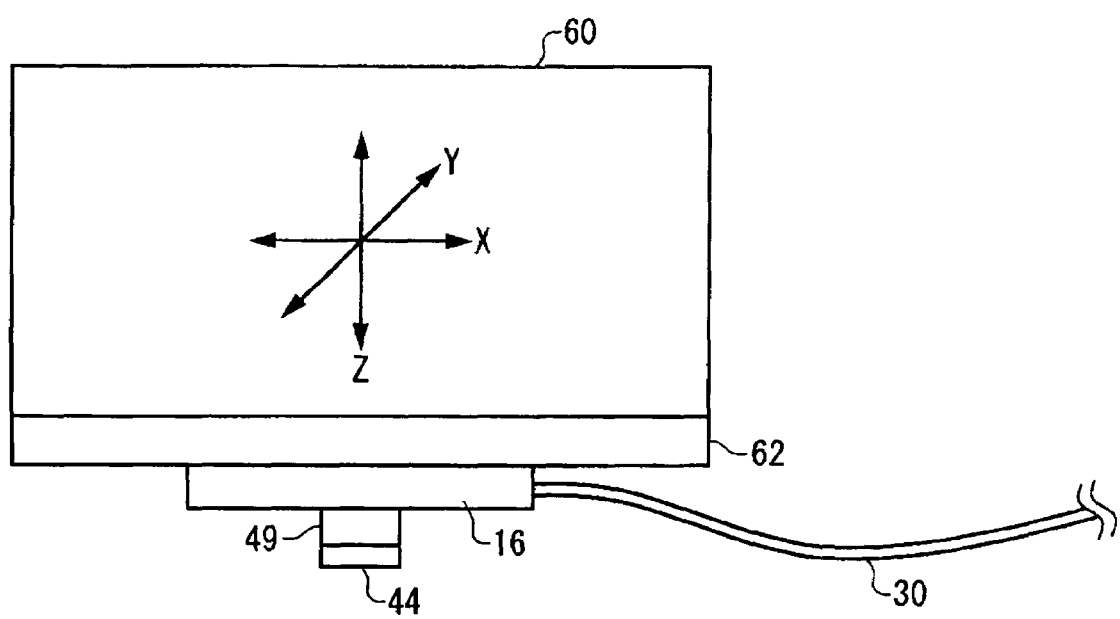
FIG. 12 shows another example of the configuration of the contact terminal for measurement 16.

FIG. 12 shows another example of the configuration of the contact terminal for measurement 16. According to the present embodiment, the bottom of the contact terminal for measurement 16 is formed such that the contact terminal for measurement 16 can be vacuum contact by the wafer chuck 62; the step section 49 projecting toward the probe substrate 23 is formed on the surface opposed to the probe substrate 23; and the contact section is provided on the surface of the step section 49 opposed to the probe substrate 23. In this case, since the contact section 44 can easily obtain a large plane, the ground terminal 24 with the large dimension can be easily formed.

Here, it is preferred that the contact terminal for measurement 16 is formed in conformity to the shape of the wafer 90 to allow a transport device of the wafer 90 to be applied. Additionally, as the coaxial cable 30 connected to the contact section 44, a flexible printed wiring may be used in order to reduce flexible stress along with the movement of the moving stage 60, for example. The signal line and the grounding conductor are patterned to be 50 ohm characteristic impedance in the flexible printed wiring. In this case, the contact terminal for measurement 16 can be removed from the moving stage 60 when the electrical characteristic is not measured. However, the position detecting section 10 specifies the contact position every time the contact terminal for measurement 16 is in vacuum-contact with the wafer chuck 62.

Hereinbefore, the case that the probe pins 22 for each of the probe groups are arranged in a line as shown in FIG. 2 and FIG. 5 has been described. However, even if the probe pins 22 are not arranged in a line but arranged by the well-known manner, the electrical characteristic and the positional information can be measured using the contact terminal for measurement 16 described with reference to FIG. 5.

Additionally, the measurement section 12 is provided outside of the testing apparatus 54 in the above description. However, the testing apparatus 54 may function as the measurement section 12 in another embodiment. For example, the signal detected by the contact terminal for measurement 16 may be captured in the main body 52 using an unused channel which is not connected to the probe pin to be measured among a number of I/O channels in the test head 28. The testing apparatus 54 has a function for measuring the voltage level by the comparator 61 as changing a sampling timing, such as a sampling oscilloscope. Accordingly, the sampling waveform of the probe pins 22 can be obtained. Thereby such as electrical characteristic can be measured without an external measurement means.

Additionally, the case that the support structure of the contact terminal for measurement 16 is fixed to the driving section 18 has been described. However, the contact terminal for measurement 16 may have the structure being capable of minutely changing an angle with the contact plane of the contact section 44 by providing an elastic member between the contact terminal for measurement 16 and the driving section 18. Thereby even if there is any variation of the level between the a plurality of probe pins 22 and the contact plane of the contact section 44, the pressing force can be uniformalized without any yawing correction function.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

As evidenced by the above description, when the transmission characteristic of a plurality of probe pins is measured, the ground terminal in contact with the probe pin allocated as a grounding pin can be easily contact with the grounding pin.

What is claimed is:

1. A contact terminal for transmitting a signal between a desired probe pin among a plurality of probe pins arranged in parallel at a predetermined distance in a predetermined arrangement direction on the primary surface of a probe substrate and an external measurement apparatus, comprising:

a signal terminal having a width smaller than a distance between probe pins provided on both sides of one probe pin in the arrangement direction, the signal terminal having a first conductor width enough to be in electrical contact with the one probe pin and not enough to be in electrical contact with the probe pins adjacent to the one probe pin;

two ground terminals to which a ground potential is applied, which are provided on both sides of the signal terminal in the arrangement direction and which have each width larger than that of the signal terminal in the arrangement direction, each of the two ground terminals having a second conductor width or a plane conductor enough to be in electrical contact with the probe pins adjacent to the one probe pin; and a signal line electrically connecting the signal terminal to the external measurement apparatus, wherein the surface of each of the signal terminal and the two ground terminals contacting with the probe pins has a non-zero degree angle with the primary surface of the probe substrate.

2. The contact terminal for measurement according to claim 1 further comprising: a contact point fixing section to which the signal terminal and the two ground terminals are fixed; and a contact fixing section of which one end is fixed to the contact point fixing section and of which other end is fixed to an external measurement apparatus, wherein the signal terminal and the two ground terminals each of which contact surface is provided such that the contact surface in contact with the probe pins has an angle with the surface of the probe substrate while the other end of the contact fixing section is fixed to the measurement apparatus.

3. The contact terminal for measurement according to claim 2, wherein the contact fixing section includes a flat plate section which is in substantially parallel with the probe substrate and is fixed to the measurement apparatus, and the signal terminal and the two ground terminals each of which contact surface is provided such that the contact surface in contact with the probe pins has an angle with the flat plate section of the contact fixing section.

4. The contact terminal for measurement according to claim 2, wherein the signal terminal and the two ground terminals are projected from an edge of the contact point fixing section opposed to the probe pins to the direction toward the probe pins.

5. In a testing apparatus including a main body, a probe substrate and a test head electrically connecting the probe substrate and the main body, for testing a device under test electrically connected to the probe substrate, a measurement apparatus for measuring the contact resistance of a plurality of probe pins electrically connected to the device under test, comprising:

a contact terminal for measurement in contact with the plurality of probe pins including the probe pin of which contact resistance should be measured;

a position detecting section for detecting the position of the contact terminal for measurement with respect to the probe substrate;

a position control section for controlling the position of the contact terminal for measurement based on the position detected by the position detecting section and for connecting the contact terminal for measurement and the probe pins; and a measurement section for measuring the contact resistance of the probe pin to be measured, wherein the contact terminal for measurement including:

a signal terminal having a width smaller than the distance between the probe pins provided on both sides of one probe pin in the arrangement direction, the signal terminal having a first conductor width enough to be in electrical contact with the one probe pin and not enough to be in electrical contact with the probe pins adjacent to the one probe pin;

two ground terminals to which a ground potential is applied, which are provided on both sides of the signal terminal in the arrangement direction and which have each width larger than that of the signal terminal, each of the two ground terminals having a second conductor width or a plane conductor enough to be in electrical contact with the probe pins adjacent to the one probe pin, wherein the position control section controls the position of the contact terminal for measurement such that the ground terminals are in contact with the plurality of probe pins including the probe pin to be measured, the measurement section causes a power supply section provided on the test head to supply a predetermined constant current to the probe pin to be measured through a driver corresponding to the probe pin to be measured among a plurality of drivers provided for each of the plurality of probe pins, and the power supply section calculates the contact resistance of the probe pin to be measured based on a voltage value applied from the power supply section to the probe pin to be measured, a voltage value of the ground terminals and a current value of the constant current.

6. The measurement apparatus according to claim 5, wherein the test head is provided corresponding to the plurality of drivers and has a plurality of switches for switching to provide either of a signal supplied by the power supply section or a signal supplied by the main body to the driver and the measurement section controls the plurality of switches, supplies the constant current generated by the power supply section to the driver corresponding to the probe pin to be measured and provides the signal at an approximately zero potential provided by the main body.

7. The measurement apparatus according to claim 6, wherein the test head further includes a comparator provided corresponding to any probe pin other than the probe pin to be measured and in parallel with the driver corresponding to the probe pin, for measuring a voltage value provided from the ground terminals to the probe pin, and the measurement section controls the driver provided in parallel with the comparator to be in an off-sate and acquires the voltage value measured by the comparator as the voltage value of the ground terminals.

8. In a testing apparatus including a main body, a probe substrate and a test head electrically connecting the probe substrate and the main body, for testing a device under test electrically connected to the probe substrate, a measurement apparatus for measuring the positions of a plurality of probe pins provided on the surface of the probe substrate and electrically connected to the device under test, comprising:

a contact terminal in contact with the probe pins;

a position control section for changing the position of the contact terminal for measurement and scanning the surface of the probe substrate;

a position detecting section for detecting the position of the contact terminal for measurement with respect to the probe substrate; and a measurement section for measuring the position of the probe pin to be measured, wherein the contact terminal for measurement including:

a signal terminal having a width smaller than a distance between the probe pins provided on both sides of one probe pins in the arrangement direction, the signal terminal having a first conductor width enough to be in electrical contact with the one probe pin and not enough to be in electrical contact with the probe pins adjacent to the one probe pin;

two ground terminals to which a ground potential is applied, which are provided on both sides of the signal terminal in the arrangement direction and which have each width larger than that of the signal terminal in the arrangement direction, each of the two ground terminals having a second conductor width or a plane conductor enough to be in electrical contact with the probe pins adjacent to the one probe pin; and a signal line electrically connecting the signal terminal to a signal input terminal of the measurement section, and wherein the measurement section causes a power supply section provided on the test head to supply a predetermined minute current to the probe pin to be measured through a driver corresponding to the probe pin to be measured among a plurality of drivers provided on the test head corresponding to the plurality of probe pins, and the measurement section measures the position of the probe pin to be measured based on the position of the contact terminal for measurement detected by the position detecting section when the signal terminal detects the minute current.

9. The measurement apparatus according to claim 8, wherein the measurement section causes the driver which is not corresponded to the probe pin to be measured to output a signal at an approximately zero potential.

10. The measurement apparatus according to claim 8, wherein the position control section sequentially change the position of the contact terminal for measurement in X-axis direction and Y-axis direction crossed at right angles in a plane in substantially parallel with the surface of the probe substrate, and Z-axis direction perpendicular to the surface of the probe substrate.

11. The measurement apparatus according to claim 10, wherein the measurement section measures the position of the tip of the probe pin to be measured in the X-axis direction, the Y-axis direction and the Z-axis direction.

12. A testing apparatus for testing a device under test, comprising:

a main body for generating a test signal provided to the device under test and determining pass/fail of the device under test based on an output signal outputted by the device under test;

a probe card on which a plurality of probe pins electrically connected to the device under test are provided;

a test head on which the probe card is placed, for transmitting/receiving a signal between the probe card and the main body; and a measurement apparatus for measuring the characteristic of the probe pin, wherein the probe card has a probe substrate on which the probe pins are provided, and the plurality of probe pins are arranged in parallel at a predetermined distance in a predetermined arrangement direction on the surface of the probe substrate, the measurement apparatus including:

a contact terminal for measurement electrically connected to a probe pin of which characteristic should be measured among the plurality of probe pins;

a position detecting section for detecting the position of the contact terminal for measurement with respect to the probe card;

a position control section for controlling the position of the contact terminal for measurement based on the position detected by the position detecting section and electrically connecting the contact terminal for measurement and the probe pin to be measured; and a measurement section for receiving an output signal outputted by the probe pin to be measured through the contact terminal for measurement and measuring the characteristic of the probe pin to be measured based on the output signal, wherein the contact terminal for measurement including:

a signal terminal having a width smaller than a distance between the probe pins provided on both sides of one probe pin in the arrangement direction, the signal terminal having a first conductor width enough to be in electrical contact with the one probe pin and not enough to be in electrical contact with the probe pins adjacent to the one probe pin;

two ground terminals to which a ground potential is applied, which are provided on both sides of the signal terminal in the arrangement direction and which have each width larger than that of the signal terminal in the arrangement direction, each of the two ground terminals having a second conductor width or a plane conductor enough to be in electrical contact with the probe pins adjacent to the one probe pin; and a signal line electrically connecting the signal terminal to a signal input terminal of the measurement section, and wherein among a plurality of drivers provided corresponding to the plurality of probe pins on the test head and electrically connected to each corresponding probe pin, a driver corresponding to the probe pin to which the wound terminal is electrically connected outputs a signal at an approximately zero potential.

13. A measurement apparatus comprising:

a contact terminal in electrical contact with a plurality of probe pins arranged on the surface of a probe substrate, for measuring the electrical characteristic of the tip of any one of the plurality of probe pins, comprising:

a signal terminal having a conductor width enough to be in electrical contact with the one probe pin and not enough to be in electrical contact with the probe pin adjacent to the one probe pin; and a ground terminal having a conductor width or a plane conductor enough to be in electrical contact with the plurality of probe pins adjacent to the one probe pin, wherein the signal terminal and the ground terminal are provided on the same plane, a position control section for moving the contact terminal for measurement to the position at which the plurality of probe pins including a probe pin to be measured is in contact with the ground terminal;

a power supply section for applying a predetermined current from a test head for holding the probe substrate to the probe pin to be measured and measuring a first voltage applied to the probe pin;

a voltage measurement means for measuring a second voltage applied from the ground terminal to a predetermined probe pin other than the probe pin to be measured among the plurality of probe pins in contact with the ground terminal; and a contact resistance calculating means for calculating a contact resistance between the probe pin to be measured and the signal terminal based on the predetermined current, the first voltage and the second voltage.

14. A measurement apparatus comprising:

a contact terminal for transmitting a signal between a desired probe pin among a plurality of probe pins arranged in parallel at a predetermined distance in a predetermined arrangement direction on the surface of a probe substrate and an external measurement apparatus, comprising:

a signal terminal having a width smaller than a distance between probe pins provided on both sides of one probe pins in the arrangement direction, the signal terminal having a first conductor width enough to be in electrical contact with the one probe pin and not enough to be in electrical contact with the probe pins adjacent to the one probe pin;

two ground terminals to which a ground potential is applied, which are provided on both sides of the signal terminal in the arrangement direction and which have each width larger than that of the signal terminal in the arrangement direction, each of the two ground terminals having a second conductor width or a plane conductor enough to be in electrical contact wit the probe pins adjacent to the one probe pin; and a signal line electrically connecting the signal terminal to the external measurement apparatus;

a position control section for moving the contact terminal for measurement to the position at which the plurality of probe pins including a probe pin to be measured is in contact with the ground terminal;

a power supply section for applying a predetermined current from a test head for holding the probe substrate to the probe pin to be measured and measuring a first voltage applied to the probe pin;

a voltage measurement means for measuring a second voltage applied from the ground terminal to a predetermined probe pin other than the probe pin to be measured among the plurality of probe pins in contact with the ground terminal; and a contact resistance calculating means for calculating a contact resistance between the probe pin to be measured and the signal terminal based on the predetermined current, the first voltage and the second voltage, wherein the position control section sequentially contacts the ground terminal of the contact terminal for measurement with all the probe pins on the probe substrate.

15. A measurement apparatus comprising:

a contact terminal for transmitting a signal between a desired probe pin among a plurality of probe pins arranged in parallel at a predetermined distance in a predetermined arrangement direction on the surface of a probe substrate and an external measurement apparatus, comprising:

a signal terminal having a width smaller than a distance between probe pins provided on both sides of one probe pins in the arrangement direction, the signal terminal having a first conductor width enough to be in electrical contact with the one probe pin and not enough to be in electrical contact with the probe pins adjacent to the one probe pin;

two ground terminals to which a ground potential is applied, which are provided on both sides of the signal terminal in the arrangement direction and which have each width larger than that of the signal terminal in the arrangement direction, each of the two ground terminals having a second conductor width or a plane conductor enough to be in electrical contact with the probe pins adjacent to the one probe pin; and a signal line electrically connecting the signal terminal to the external measurement apparatus;

a position control section for moving the contact terminal for measurement to the position at which the plurality of probe pins including a probe pin to be measured is in contact with the ground terminal;

a power supply section for applying a predetermined current from a test head for holding the probe substrate to the probe pin to be measured and measuring a first voltage applied to the probe pin;

a voltage measurement means for measuring a second voltage applied from the ground terminal to a predetermined probe pin other than the probe pin to be measured among the plurality of probe pins in contact with the ground terminal; and a contact resistance calculating means for calculating a contact resistance between the probe pin to be measured and the signal terminal based on the predetermined current, the first voltage and the second voltage, wherein the position control section changes a pressing distance for pressing the contact terminal for measurement and calculates the contact resistance of the plurality of different pressing distances for each of the probe pins.

16. The measurement apparatus according to claim 15, wherein the power supply section sequentially applies the predetermined current to the plurality of probe pins, and the position measurement means measures the position of the tip for each of the plurality of probe pins and measures a relative displacement for each of the probe pins.

17. A measurement apparatus comprising:

a contact terminal for transmitting a signal between a desired probe pin among a plurality of probe pins arranged in parallel at a predetermined distance in a predetermined arrangement direction on the surface of a probe substrate and a external measurement apparatus, comprising:

a signal terminal having a width smaller than a distance between probe pins provided on both sides of one probe pins in the arrangement direction, the signal terminal having a first conductor width enough to be in electrical contact with the one probe pin and not enough to be in electrical contact with the probe pins adjacent to the one probe pin;

two ground terminals to which a ground potential is applied, which are provided on both sides of the signal terminal in the arrangement direction and which have each width larger than that of the signal terminal in the arrangement direction, each of the two ground terminals having a second conductor width or a plane conductor enough to be in electrical contact with the probe pins adjacent to the one probe pin; and a signal line electrically connecting the signal terminal to the external measurement apparatus;

a power supply section for applying a predetermined current from a test head for holding the probe substrate to a probe pin to be measured and measuring a voltage applied to the probe pin;

a position control section for moving the contact terminal for measurement in a plane in substantially parallel with the surface of the probe substrate at a level at which the surface of the probe substrate is in contact with the tip of the probe pin; and a position measurement means for calculating the position of the contact terminal when the probe pin to be measured is in contact with the ground terminal based on the change of the voltage applied to the probe pin and measuring the position of the tip of the probe pin based on the calculated position.

18. A measurement apparatus comprising:

a contact terminal in electrical contact with a plurality of probe pins arranged on the surface of a probe substrate, for measuring the electrical characteristic of the tip of any one of the plurality of probe pins, comprising:

a signal terminal having a conductor width enough to be in electrical contact with the one probe pin and not enough to be in electrical contact with the probe pin adjacent to the one probe pin; and a ground terminal having a conductor width or a plane conductor enough to be in electrical contact with the plurality of probe pins adjacent to the one probe pin, wherein the signal terminal and the ground terminal are provided on the same plane, a power supply section for applying a predetermined current from a test head for holding the probe substrate to a probe pin to be measured and measuring a voltage applied to the probe pin;

a position control section for moving the contact terminal for measurement in a plane in substantially parallel with the surface of the probe substrate at a level at which the surface of the probe substrate is in contact with the tip of the probe pin; and a position measurement means for calculating the position of the contact terminal when the probe pin to be measured is in contact with the ground terminal based on the change of the voltage applied to the probe pin and measuring the position of the tip of the probe pin based on the calculated position.

* * * * *